United States Patent [19]
Shimada

[11] Patent Number: 5,934,505
[45] Date of Patent: Aug. 10, 1999

[54] APPARATUS FOR FEEDING CHIP COMPONENTS AND CARTRIDGE TYPE CHIP COMPONENT CONTAINER

[75] Inventor: Katsumi Shimada, Kasukabe, Japan

[73] Assignee: Pop Man Corporation, Kasukabe, Japan

[21] Appl. No.: 08/841,679

[22] Filed: Apr. 30, 1997

[30] Foreign Application Priority Data

May 1, 1996 [JP] Japan .................................. 8-110747
Feb. 21, 1997 [JP] Japan .................................. 9-038118

[51] Int. Cl.⁶ .................................................. B23Q 7/00
[52] U.S. Cl. ........................... 221/236; 221/200; 221/224; 221/157; 198/396
[58] Field of Search .................................... 221/200, 202, 221/211, 224, 236, 239, 253, 157, 163; 198/396, 443, 454; 29/740

[56] References Cited

U.S. PATENT DOCUMENTS

| | | | |
|---|---|---|---|
| 2,828,888 | 4/1958 | Nicolle | 221/263 |
| 3,086,639 | 4/1963 | Donofrio | 198/396 |
| 3,907,218 | 9/1975 | Lee | 221/157 |
| 4,457,451 | 7/1984 | Ichikawa | 221/190 |
| 4,459,743 | 7/1984 | Watanabe et al. | 29/740 |
| 4,744,455 | 5/1988 | Dragotta et al. | 198/396 |
| 4,801,044 | 1/1989 | Kubota et al. | 221/163 |
| 5,007,534 | 4/1991 | Tamaki et al. | 206/329 |
| 5,337,465 | 8/1994 | Tamaki et al. | 29/740 |

FOREIGN PATENT DOCUMENTS 62-280129 12/1987 Japan.
03060198 3/1991 Japan.

OTHER PUBLICATIONS

Patent Abstracts of Japan, vol. 061, No. 282 (M–1269), Jun. 23, 1992.
Patent Abstracts of Japan, vol. 012, No. 164 (M–698), May 18, 1998.

*Primary Examiner*—William E. Terrell
*Assistant Examiner*—Khoi H. Tran
*Attorney, Agent, or Firm*—Jacobson, Price, Holman & Stern, PLLC

[57] ABSTRACT

An apparatus for feeding chip components includes a component container for containing many chip components in bulk, a first component reservoir for storing the chip components in bulk. The component container is attached to the first component reservoir. The apparatus further includes a second component reservoir provided under the first component reservoir for two-dimensionally storing the chip components in a space so that the chip components are not overlapped in their thickness direction, and a component alignment path provided under the second component reservoir for one-dimensionally aligning the chip components. The apparatus further includes an alignment palate having first and second alignment portions. The first alignment portion is provided between the first component reservoir and the second component reservoir for two-dimensionally aligning the chip components and letting the chip components move down by their own weight. The second alignment portion is provided between the second component reservoir and the component alignment path for one-dimensionally aligning the chip components and letting the chip components move down by their own weight. A device moves out the chip components on the component alignment path to a predetermined position.

6 Claims, 20 Drawing Sheets

APPARATUS FOR FEEDING CHIP COMPONENTS AND CARTRIDGE TYPE CHIP COMPONENT CONTAINER

BACKGROUND OF THE INVENTION

1. Field of the Invention

The present invention relates to an apparatus for feeding chip components and a cartridge type component container, and in particular to an apparatus for feeding chip components which feeds the chip components contained in a component container in bulk while aligning such components in a line. The apparatus and the cartridge type component container may be applied to an automatic mounting device for mounting chip electronic components.

2. Description of the Related Art

Various kinds of chip components are mounted on a print circuit board. An automatic mounting device transfers such chip components to the print circuit board and then mounts the chip components on the board. A chip component feeder has been used to feed the chip components to the automatic mounting device. Various kinds of the chip component feeders such as a vibration type, a rotating type, an oscillation type and a belt type are known.

Japanese Patent Laid-Open No. 62-280129 (the first prior art) discloses a chip component alignment and separation apparatus. The apparatus is provided with a chip component reservoir containing many ship components in bulk. The chip component reservoir includes a declined surface in its inside so that the chip components can move down by their own weight. The lowest end of the chip component reservoir is connected with a chip alignment opening, and an air nozzle opening is disposed near the chip alignment opening for ejecting high pressure air. The chip components at the lowest portion of the reservoir are blown upwardly by the high pressure air from the air nozzle opening, and then the chip components fall down by their weight and advance into the chip alignment opening. The cross section of the chip alignment opening is formed so as to have the same shape as that of the cross section of the chip component. Therefore, the chip components can align themselves in the chip alignment opening, and then the chip components are individually picked up by a pick up machine.

Japanese Patent Publication No. 7-48596 (the a second prior art) discloses a container for containing electronic components. The container is provided with a body portion including a spiral path for containing the chip components therein. The chip components are contained in the spiral path in advance, and then the container is supplied.

In the apparatus shown in the first prior art, whether or not the chip components can advance with sureness into the chip alignment opening depends mostly on the attitudes of the chip components while the components are falling down in the component reservoir. Therefore, the chip components can not advance into the chip alignment opening with certain possibility. As a result, in the conventional apparatus, it is difficult for the chip components to advance with sureness into the chip alignment path. Further, when it is necessary to determine the front and rear surfaces of the chip components, such determination is carried out after the chip components have advanced into the chip alignment opening and then the attitudes of the chip components are changed. As a result, according to the apparatus in the first prior art, the feeding speed is relatively low, the mechanical structure is complex, and therefore the cost is high.

In the container shown in the second prior art, the chip components can be contained in the container with the front and rear surfaces being determined in advance. However, the width of the spiral path must be shaped so as to correspond to the widths of the various kinds of the chip components, and therefore many kinds of such containers have to be prepared. Further, the container can not contain many chip components in the spiral path thereof. As a result, the conventional container is high in cost and can not feed many chip components.

SUMMARY OF THE INVENTION

It is therefore an object of the present invention to provide an apparatus for feeding chip components which can surely and effectively feed chip components in bulk.

It is another object of the present invention to provide an apparatus for feeding chip components which can feed many chip components at a low cost and with a relatively simple structure.

It is still another object of the present invention to provide an apparatus for containing chip components whose front and rear surfaces are oriented so as to face to the respective same directions in advance and feeding such ship components.

It is still another object of the present invention to provide a cartridge type component container which can contain chip component whose front and rear surfaces are oriented so as to face to the respective same directions in advance and which is attached to an apparatus for feeding chip components.

These and other objects are achieved according to the present invention in one aspect thereof by providing an apparatus for feeding chip components comprising a component container for containing many chip components in bulk, a first component reservoir for storing the chip components in bulk, the component container being attached to the first component reservoir and the first component reservoir having a declined bottom portion on which the chip components move down by their weight, a second component reservoir provided under the first component reservoir for two-dimensionally storing the chip components in a space so that the chip components are not overlapped in their thickness direction, the second component reservoir having a declined bottom portion on which the chip components move down by their own weight, a component alignment path provided under the second component reservoir for one-dimensionally aligning the chip components, the component alignment path having a cross section which corresponds to the cross section of the chip component, first alignment means provided between the first component reservoir and the second component reservoir for two-dimensionally aligning the chip components and letting the chip components move down by their own weight, second alignment means provided between the second component reservoir and the component alignment path for one-dimensionally aligning the chip components and letting the chip components move down by their own weights, and means for moving out the chip components on the component alignment path to a predetermined position.

These and other objects are also achieved according to the present invention in another aspect thereof by providing an apparatus for feeding chip components comprising two first component reservoirs for respectively storing chip components in bulk, two component containers each of which contains many chip components and each being attachable to a corresponding one of the first component reservoirs, each of the first component reservoirs having a declined bottom portion on which the chip components move down by their own weight, two second component reservoirs respectively provided under the first component reservoirs for two-dimensionally storing the chip components in a space so that the chip components are not overlapped in their thickness direction, the second component reservoirs each having a declined bottom portion on which the chip components move down by their own weight, two component alignment paths respectively provided under the second component reservoirs for one-dimensionally aligning the chip components, the component alignment paths each having a cross section which corresponds to the cross section of the chip component, a single first alignment means provided between the first component reservoirs and the second component reservoirs for two-dimensionally aligning the chip components in the respective first component reservoirs and letting the chip components move down by their own weight toward the respective second component reservoirs, a single second alignment means provided between the second component reservoirs and the component alignment paths for one-dimensionally aligning the chip components in the respective second component reservoirs and letting the chip components move-down by their own weight toward the respective component alignment paths, and means for moving out the chip components on the component alignment path to a predetermined position.

These and other objects are also achieved according to the present invention in still another aspect thereof by providing a cartridge type container for two-dimensionally containing many chip components in a space so that the chip components are not overlapped in their thickness direction, the front and rear surfaces of the chip components being determined and oriented so as to face to the same directions in advance before being contained therein.

DESCRIPTION OF THE PREFERRED EMBODIMENTS

The present invention will now be explained with reference to the preferred embodiments and the drawings.

Figure 1:
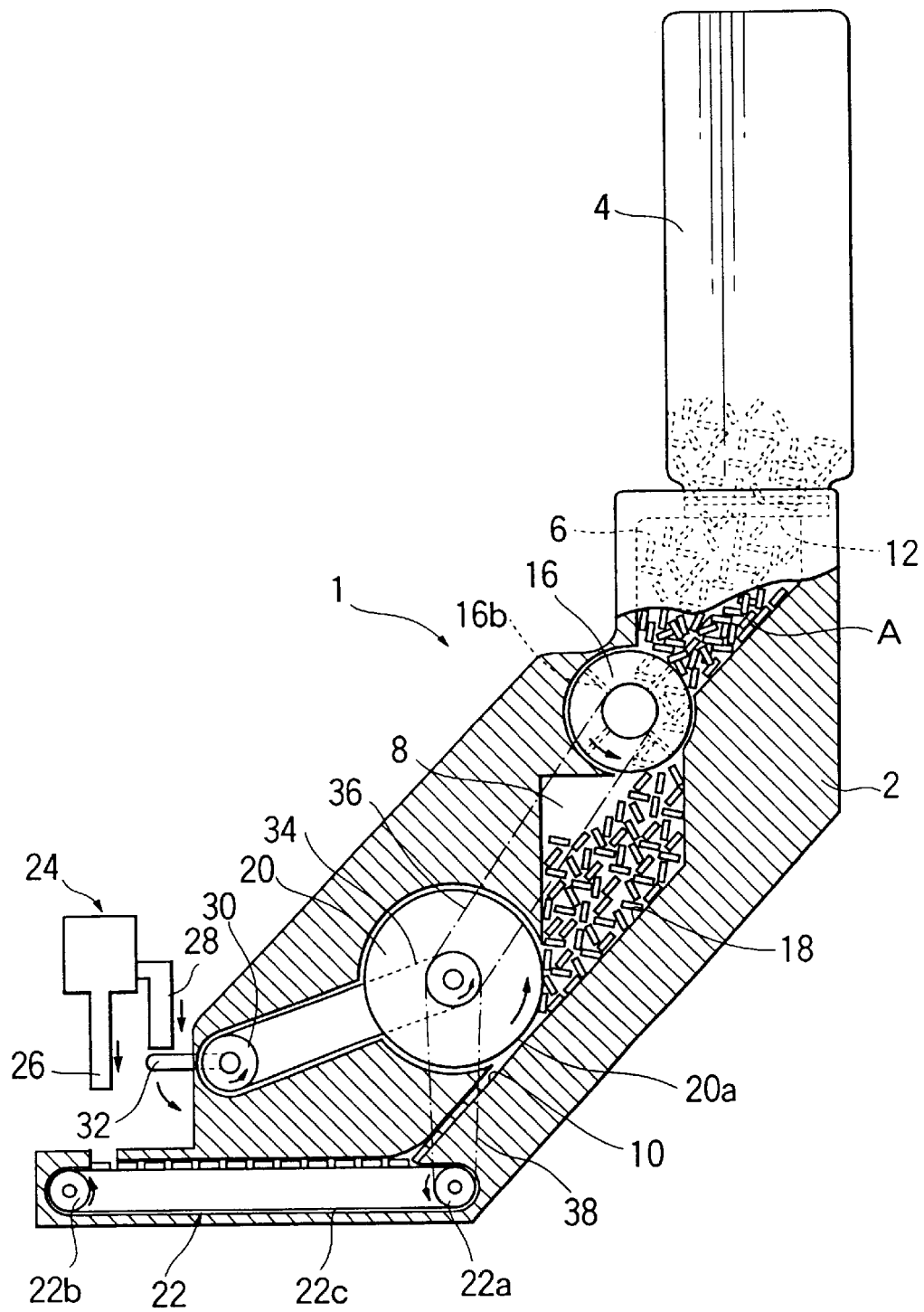
FIG. 1 is a partial front sectional view showing a chip component feeding apparatus according to a first embodiment of the present invention.
Figure 2:
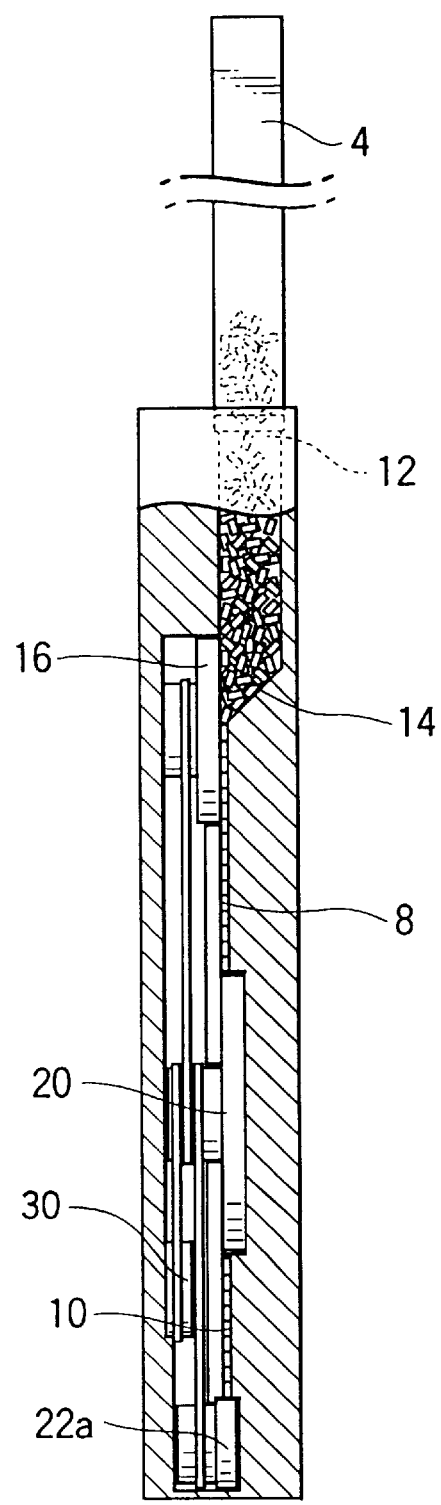
FIG. 2 is a side sectional view showing the apparatus in FIG. 2.
Figure 3:
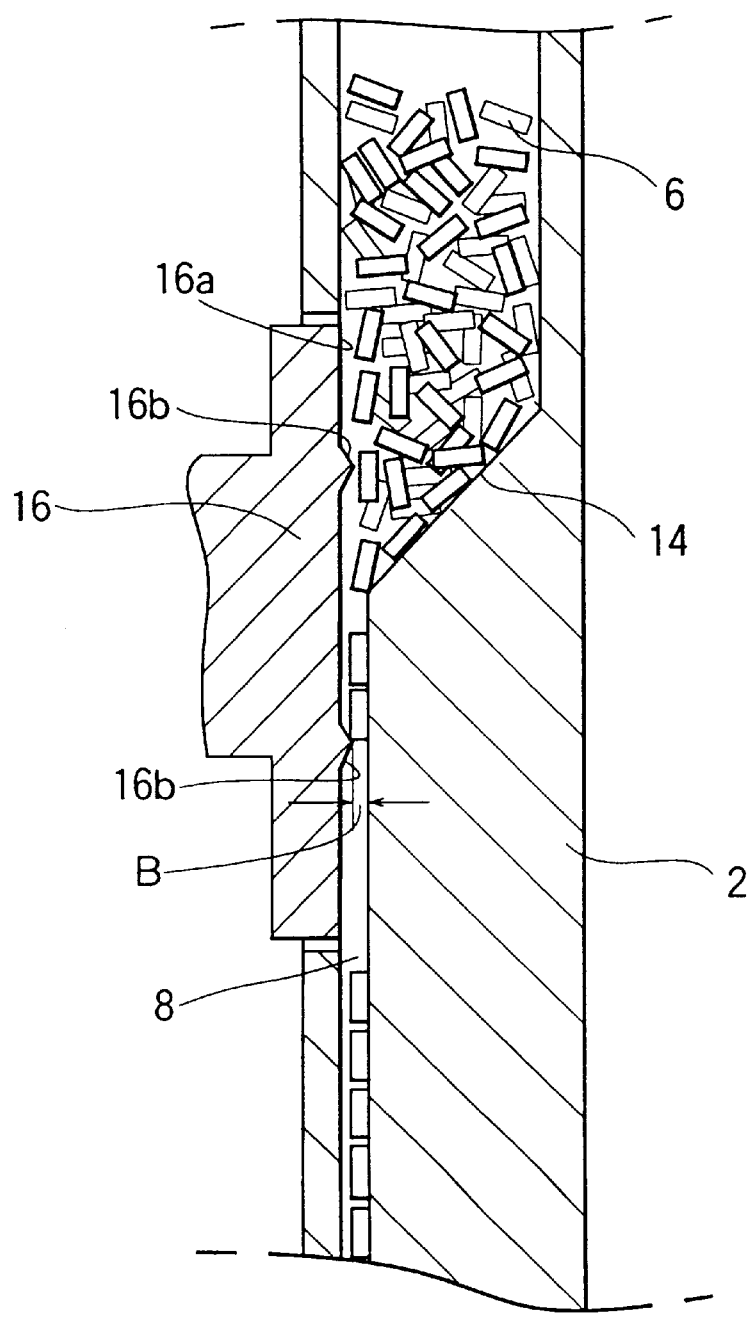
FIG. 3 is an enlarged sectional view of FIG. 2.
Figure 4:
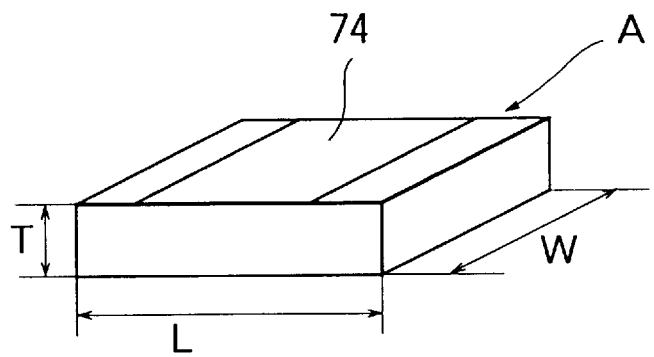
FIG. 4 is a perspective view showing a chip component.
Figure 5:
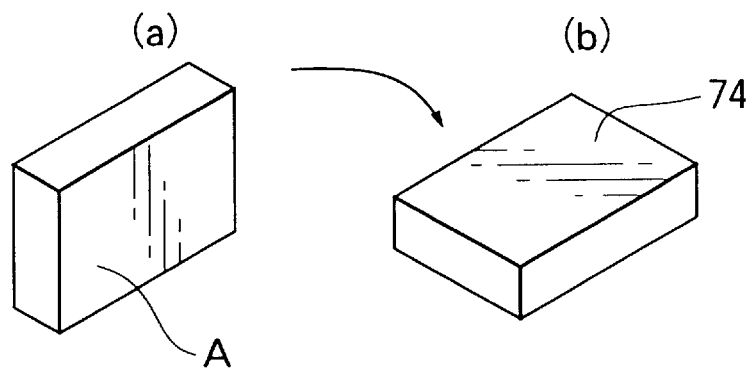
FIG. 5 is a view showing how the attitude of the chip component is changed according to the first embodiment of the present invention.
Figure 6:
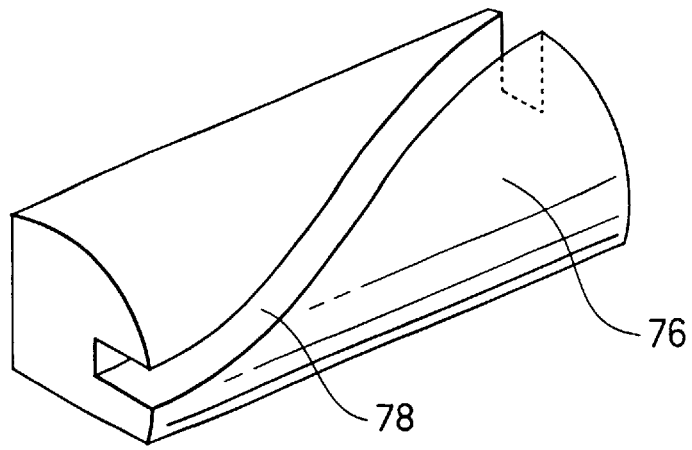
FIG. 6 is a perspective view showing a chip component attitude changing mechanism used in the first embodiment of the present invention.

A first embodiment of the present invention will be explained with reference to FIGS. 1–6. FIG. 1 is a partial front sectional view showing a chip component feeding apparatus, FIG. 2 is a side sectional view, FIG. 3 is an enlarged sectional view of FIG. 2, FIG. 4 is a perspective view showing a chip component, FIG. 5 is a view showing how the attitude of the chip component is changed, and FIG. 6 is a perspective view showing a chip component attitude changing mechanism.

Referring to FIG. 1, a chip component feeding apparatus 1 is provided with a housing 2. A chip component container 4 contains many chip components A, such as thousands to tens of thousands, in bulk. As the chip component container 4, for example, a bulk case for surface mounting devices explained in "EIAJ ET-7201" of the Standard of Electronic Industries Association of Japan (EIAJ) is commercially available. Examples of the chip component A are chip capacitors having, for example, a length (L=1.0 mm), a width (W=0.5 mm) and a thickness (T=0.5 mm) and chip resistors having, for example, a length (L=1.6 mm), a width (W=0.8 mm) and a thickness (T=0.45 mm). The chip capacitors are explained in "EIAJ RC-2322" and the chip resistors are explained in "EIAJ RC-2130". FIG. 4 shows a chip resistor as an example of the chip component A.

The chip component feeding apparatus 1 includes a first component reservoir 6 for three-dimensionally storing the chip components in bulk, a second component reservoir 8 for two-dimensionally storing the chip components in a space so that the chip components A are not overlapped in their thickness direction, and a component alignment path 10 for one-dimensionally aligning the chip components in a line. The cross section of the path 10 corresponds to the cross section of the chip component A. Within the housing 2 of the chip component feeding apparatus 1, the first component reservoir 6 is disposed within the upper portion of the housing 2, the second component reservoir 8 is located under the first component reservoir 6, and the component alignment path 10 is located under the second component reservoir 8.

The chip component container 4 is attached on an upper opening 12 of the first component reservoir 6, and then the chip components A contained in the container 4 are supplied into the first component reservoir 6.

As shown in FIG. 2, a bottom portion 14 of the first component reservoir 6 is constructed to be declined so that the chip components A slip down thereon by their own weights, and the bottom portion 14 is connected to the second component reservoir 8.

A first alignment rotating disc 16 is disposed between the first component reservoir 6 and the second component reservoir 8. As shown in FIG. 3, one side surface 16a facing the reservoirs 6 and 8 of the first alignment rotating disc 16 is provided with four radially extending projections 16b (see FIGS. 1 and 3). The distance B (see FIG. 3) between the projections 16b of the first disc 16 and the surface of the second reservoir 8 is less than the thickness T of the chip component A. The first disc 16 rotates in a counterclockwise direction so that the chip components A are forced to move upwardly.

As shown in FIG. 1, a bottom portion 18 of the second component reservoir 8 is constructed to be declined so that the chip components A slip down thereon by their own weight, and the bottom portion 18 is connected to the component alignment path 10 for aligning the chip components A in a line.

As shown in FIGS. 1 and 2, a second alignment rotating disc 20 is disposed between the second component reservoir 8 and the component alignment path 10. The peripheral surface 20a facing both the second reservoir 8 and the component alignment path 10 of the second alignment rotating disc 20 is provided with high friction material such as a rubber or a high friction mechanism such as notch grooves. The second disc 20 rotates in a counterclockwise direction so that the chip components A are forced to move upwardly.

A roller device 22 for conveying out the chip components is disposed under the component alignment path 10 within the housing 2 of the chip component feeding apparatus 1. The roller device 22 is composed of a first roller 22a disposed under the upstream portion of the path 10, a second roller 22b disposed under the downstream portion of the path 10 and a conveyor belt 22c connected with the first and second rollers 22a and 22b for conveying the chip components A.

As shown in FIG. 1, an automatic mounting device 24 is disposed above the downstream portion of the component alignment path 10. The automatic mounting device 24 includes a nozzle 26 for individually picking up the chip components A and an arm 28 for providing a predetermined timing of the chip component feeding apparatus 1, both of which are attached to extend downwardly.

As shown in FIG. 1, a driven roller 30 is provided within the housing 2 near the automatic mounting device 24. A lever 32, which is rotated in a counterclockwise direction by the downward motion of the arm 28, is connected through a drive mechanism (not shown) to the driven roller 30. The driven roller 30 is connected with the second disc 20 through a first drive belt 34, and the second disc 20 is respectively connected with the first disc 16 through a second drive belt 36 and with the first roller 22a of the roller device 22 through a third drive belt 38. The drive mechanism of the driven roller 30 is operated as follows. That is, when the lever 32 is rotated in a counterclockwise direction by the downward movement of the arm 28, the driven roller 30 together with the lever 32 is rotated in a counterclockwise direction and then the first drive belt 34 is rotated in a counterclockwise direction. On the other hand, when the arm 28 moves upwardly, the lever 32 returns back to its original position shown in FIG. 1 and the driven roller 30 is not rotated together with the lever 32.

In the first embodiment of the present invention, as explained above, the driven roller 30 is driven at a predetermined timing by the upward and downward motions of the arm 28 of the automatic mounting device 24 and the rotating motion of the lever 32. However, in the first embodiment, instead of using the arm 28 and the lever 32, the driven roller 30 may be driven at a predetermined timing by a cylinder mechanism (not shown) or a thin motor (not shown), both of which are disposed in the housing 2 of the chip component feeding apparatus 1.

In operation, the component container 4 containing the chip components A in bulk is attached to the upper opening 12 of the first component reservoir 6, and then the chip components A in the container 4 are supplied into the first reservoir 6.

The chip components A three-dimensionally stored in bulk in the first reservoir 6 slip down by their own weight along the declined bottom portion 14 of the first reservoir 6. At this time, the chip components A are sometimes excessively concentrated at the downward portion of the bottom portion 14 and as a result the chip components A can not fall into the second component reservoir 8. However, according to the first embodiment, the excessively concentrated chip components A are forced to move upwardly by the upward motion of the projections 16b on the one side surface 16a of the first alignment disc 16. As a result, the excessive concentration of the chip components A is resolved and the chip components A, having a two-dimensional condition under which the chip components A are not overlapped in their thickness direction, slip smoothly downwardly by their own weight toward the second component reservoir 8.

As explained above, the four projections 16b are provided on the one side surface 16a of the first disc 16. In the first embodiment, the number of projection 16b is determined so that the chip components A can be forced to move upwardly at least one time when the arm 28 of the automatic mounting device 24 moves downwardly and upwardly one time.

Thereafter, the chip components A are two-dimensionally stored in the space of the second component reservoir 8 so that the chip components are not overlapped in their thickness direction, and then the chip components A slip down by their own weight along the bottom portion 18. At this time, the chip components A, being caught between the chip components A aligning on the bottom portion 18 of the second reservoir 8 and about to slip into the component alignment path 10 and the peripheral surface 20a of the second disc 20, are forced to move upwardly by the friction force caused between the chip components A and the peripheral surface 20a. As a result, a space between the second reservoir 8 and the path 10 is formed and therefore the chip components A slip soothly downwardly by their own weight toward the component alignment path 10 and the chip components A are finally aligned on the path 10.

Each time the automatic mounting device 24 moves downwardly, the nozzle 26 individually picks up the chip components A on the component alignment path 10.

The arm 28 simultaneously moves downwardly to push down the lever 32. The rotating motion of the lever 32 rotates the driven roller 30 to a predetermined angle and then the rotating motion of the driven roller 30 drives the first, second and third driving belts 34, 36 and 38. Thus, the first disc 16, the second disc 20 and the roller device 22 are operated at a predetermined timing which is synchronized with the downward motion of the automatic mounting device 24. The first and second discs 16 and 20 respectively is rotated to respective predetermined angles, and the first roller 22a of the roller device 22 is also rotated to a predetermined angle. The rotating motion of the first roller 22a makes the chip components A on the conveyor belt 22c move toward the left side direction in FIG. 1. Thus, the chip components A on the component alignment path 10 are individually conveyed out at a predetermined timing by the roller device 22 to a picking up position which is located just under the nozzle 26 of the automatic mounting device 24.

In the first embodiment, when the cross section of the chip component A is rectangular, the attitude of the chip component A has to be changed by 90 degrees in a direction perpendicular to the moving out direction of the chip components. Referring to FIGS. 4 through 6, when the chip components A are supplied to the automatic mounting device 24, a vacuumed surface 74 or a main surface of the chip component A must face upwardly. Therefore, the attitude, shown in FIG. 5(a), of the chip component A supplied to the component alignment path 10 has to be changed by 90 degrees to the attitude, shown in FIG. 5(b). Therefore, in the first embodiment, a component attitude changing mechanism 76 having a changing groove 78 is disposed in the declined portion of the upstream portion of the component- alignment path 10 as shown in FIG. 6. The component attitude changing mechanism 76 is made of a resin and the like. The chip components A are aligned in a line in the component alignment path 10 and then the attitudes of the chip components A are changed by 90 degrees in the direction perpendicular to the chip component moving out direction while the chip components A smoothly slip down by their own weight without receiving mechanical pressure in the changing groove 78 of the component attitude changing mechanism 76. As a result, since the mechanism 76 does not include moving parts, the structure of the mechanism 76 is simple and the manufacturing cost is low. Further, the mechanism 76 can be manufactured easily.

The component attitude changing mechanism 76 having the changing groove 78 may be made of a resin mold. In this case, the complicated machining processes are not necessary.

A second embodiment of the present invention will be explained with reference to FIGS. 7–15. In the second embodiment, an alignment plate moving up and down is employed instead of the first alignment rotating disc 16 and the second alignment rotating disc 20 of the first embodiment.

Figure 7:
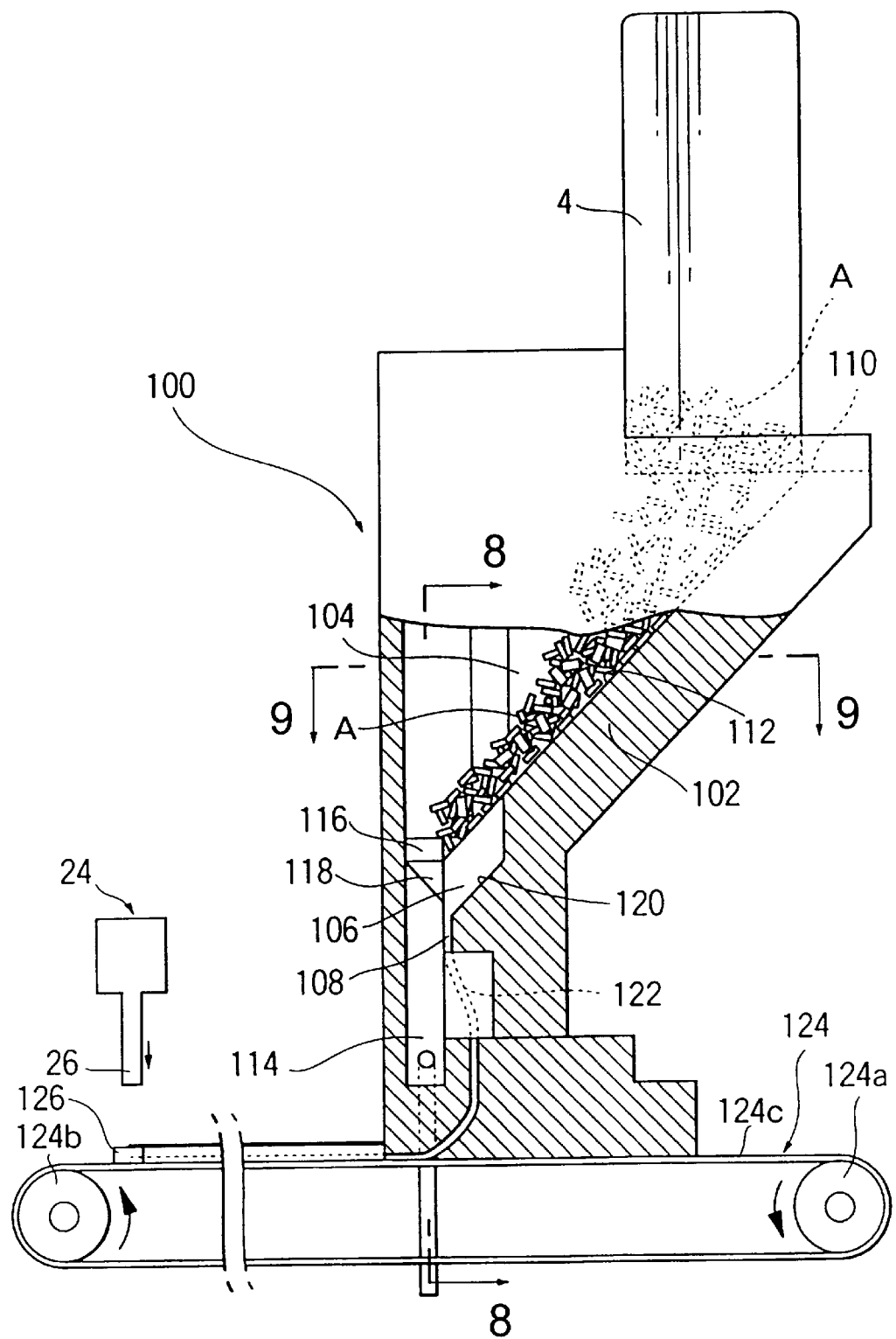
FIG. 7 is a partial front sectional view showing a chip component feeding apparatus. according to a second embodiment of the present invention.
Figure 8:
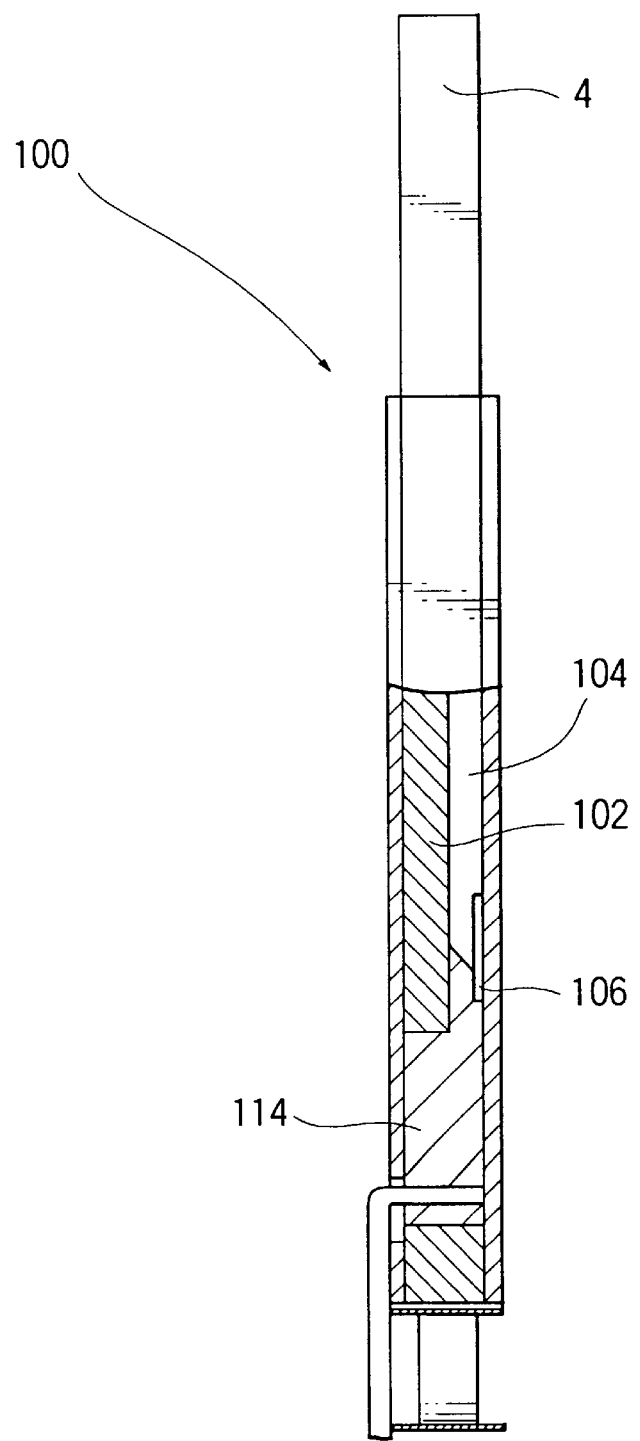
FIG. 8 is a partial side sectional view as taken along line C—C in FIG. 7.
Figure 9:
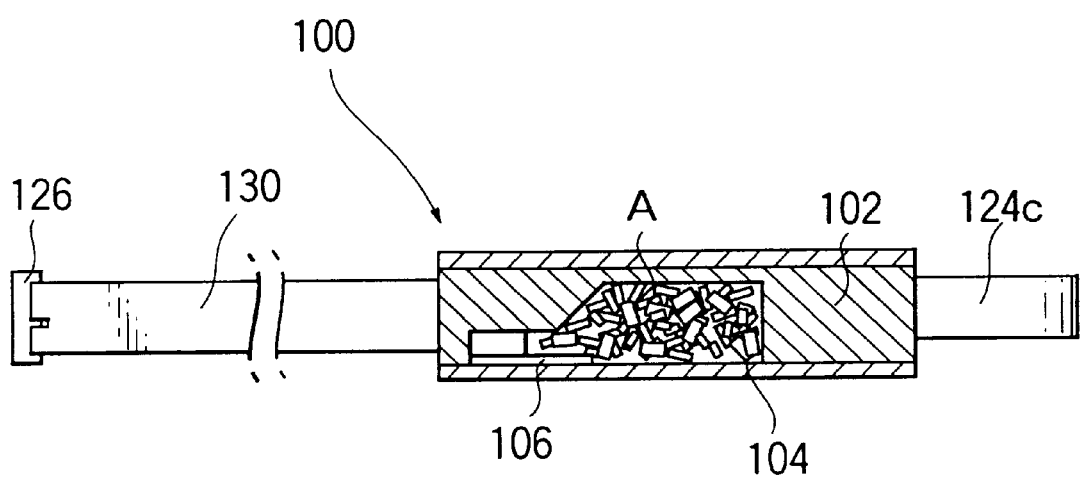
FIG. 9 is a partial sectional view as taken along line D—D in FIG. 7.
Figure 10:
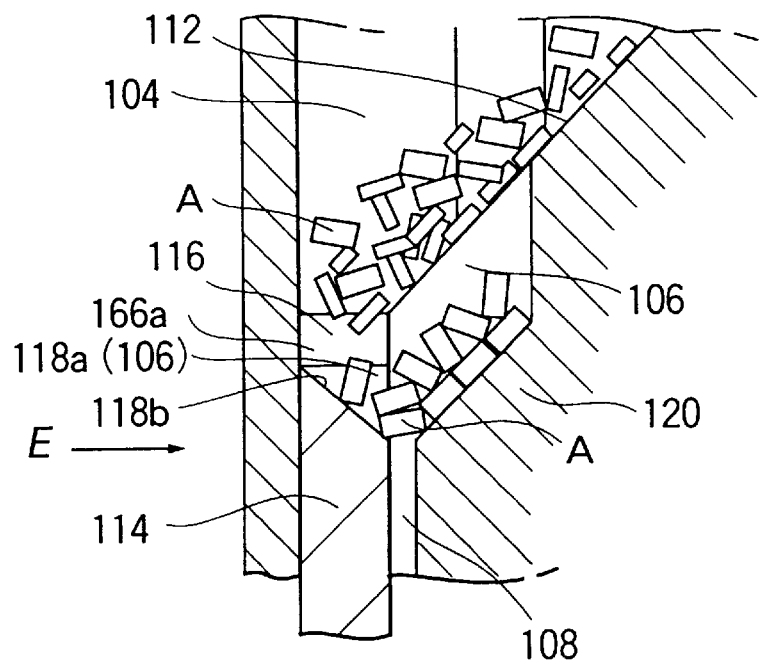
FIG. 10 is an enlarged sectional view showing a second component reservoir and its neighborhood according to the second embodiment of the present invention.
Figure 11:
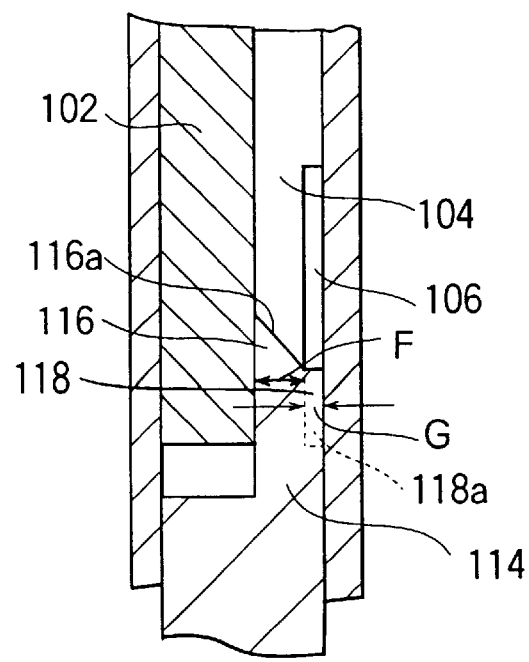
FIG. 11 is a partial enlarged sectional view as seen from E direction in FIG. 10.
Figure 12:
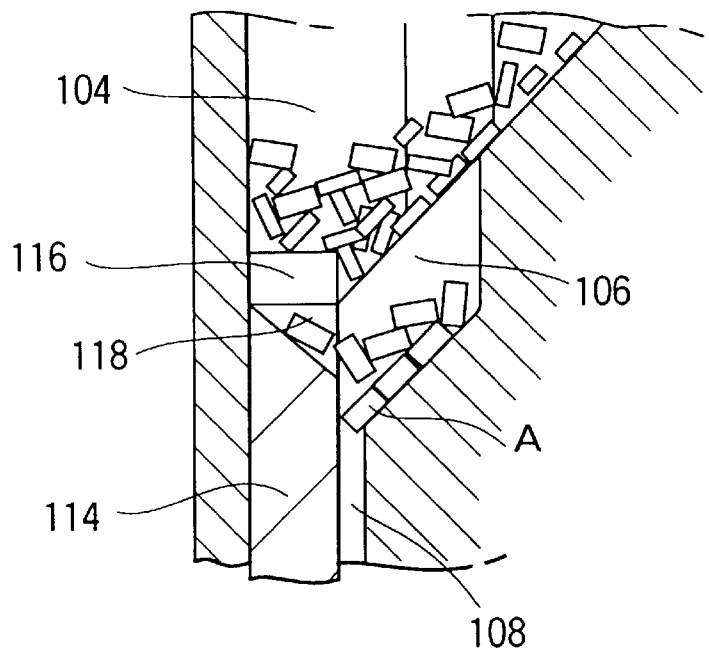
FIGS. 12 and 13 are enlarged sectional views respectively showing conditions when an alignment plate moves up and down.
Figure 13:
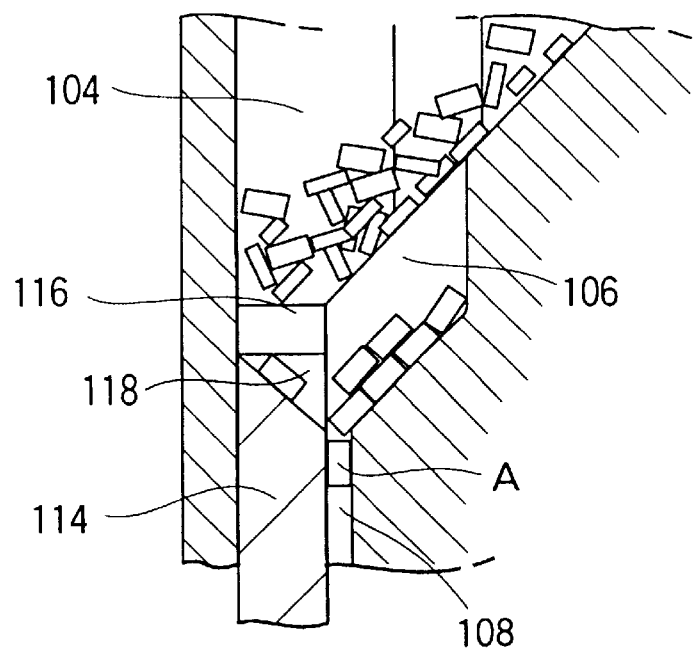
Figure 14:
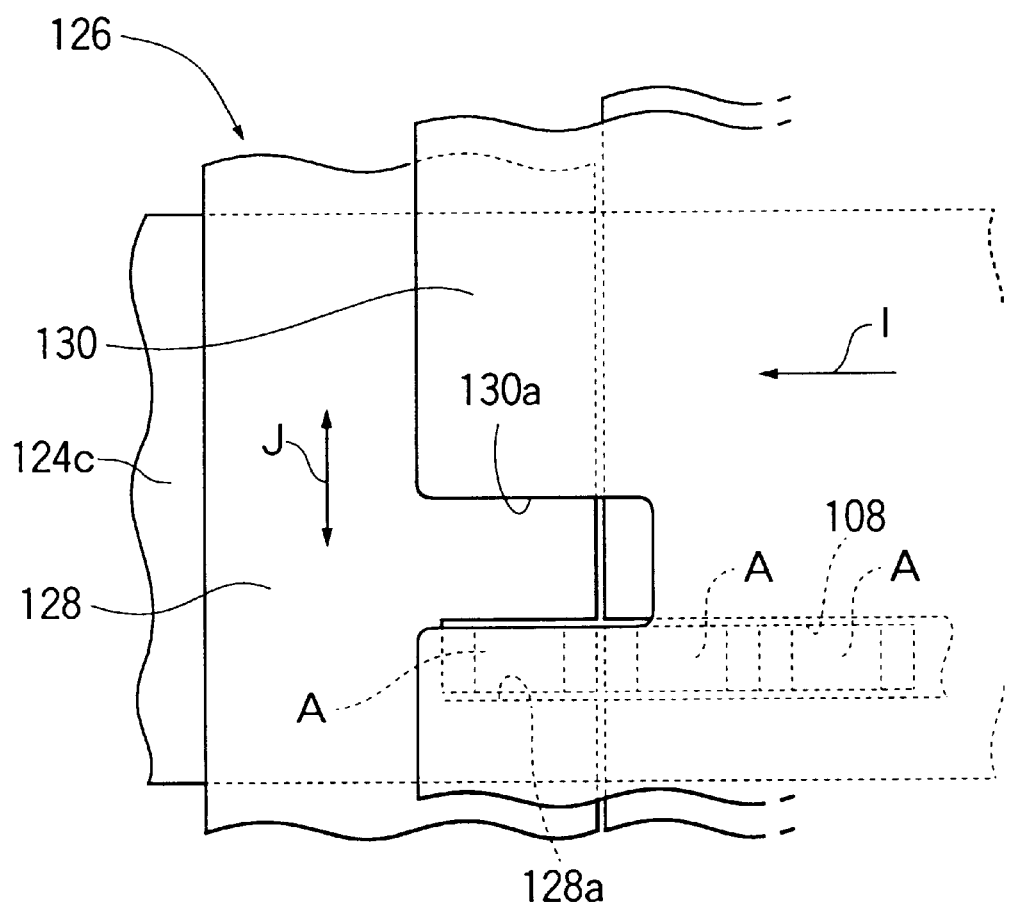
FIGS. 14 and 15 are partial plan views respectively showing a component separating operation at an end of a roller device according to the second embodiment.
Figure 15:
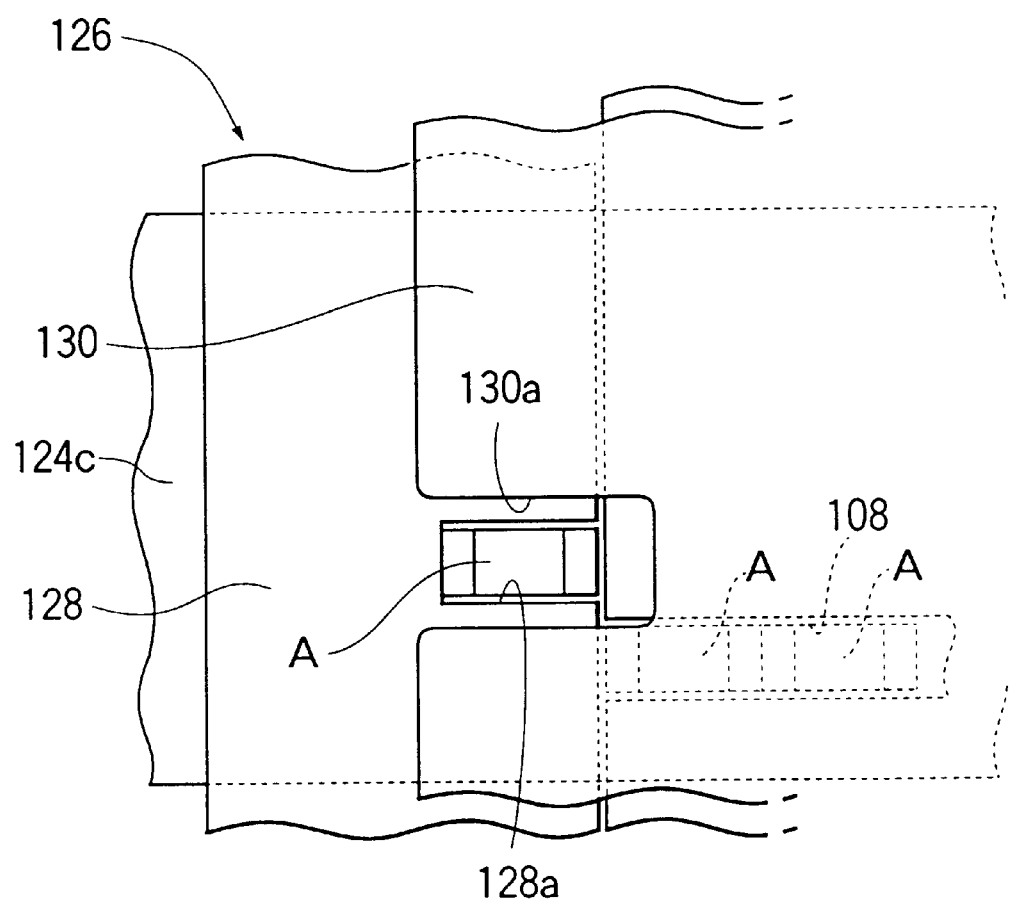

FIG. 7 is a front sectional view showing a chip component feeding apparatus, FIG. 8 is a partial sectional view taken along line C—C in FIG. 7, FIG. 9 is a partial sectional view taken along line D—D in FIG. 7, FIG. 10 is an enlarged sectional view showing a second component reservoir and its neighborhood, FIG. 11 is a partial enlarged sectional view as seen from direction E in FIG. 10, FIGS. 12 and 13 are enlarged sectional views respectively showing conditions when an alignment plate moves up and down, and FIGS. 14 and 15 are partial plan views respectively showing a component separating operation at an end of a roller device.

Referring to FIGS. 7–9, a chip component feeding apparatus 100 is provided with a housing 102. A chip component container 4 contains many chip components A in bulk.

The chip component feeding apparatus 100 includes a first component reservoir 104 for three-dimensionally storing the chip components in bulk, a second component reservoir 106 for two-dimensionally storing the chip components in a space so that the chip components A are not overlapped in their thickness direction, and a component alignment path 108 for one-dimensionally aligning the chip components. The cross section of the path 10 corresponds to the cross section of the chip component A. Within the housing 102 of the chip component feeding apparatus 100, the first component reservoir 104 is disposed in the upper portion of the housing 102, the second component reservoir 106 is located under the first component reservoir 104, and the component alignment path 108 is located under the second component reservoir 106.

The chip components container 4 is attached on an upper opening 110 of the first component reservoir 104, and then the chip components A contained in the container 4 are supplied into the first component reservoir 104.

As shown in FIGS. 7 and 10, a bottom portion 112 of. the first component reservoir 104 is constructed to be declined so that the chip components A slip down thereon by their own weight, and the bottom portion 112 is connected to the second components reservoir 106. Further, a bottom portion 120 of the second component reservoir 106 is constructed to be declined so that the chip components A slip down thereon by their own weight, and the bottom portion 120 is connected to the component alignment path 108 for aligning the chip components A in a line.

An alignment plate 114 is disposed so as to move up and down in the space defined by the first reservoir 104, the second reservoir 106 and the component alignment path 108. The alignment plate 114 is provided with a first alignment portion 116 on its upper portion and a second alignment portion 118 under the first alignment portion 116. The first alignment portion 116 of the alignment plate 114 has a thickness F as shown in FIG. 11 and is provided with a declined surface 116a on which the chip components A in the first reservoir 104 slip down by their own weight toward the second reservoir 106. Further, as shown in FIG. 11, the second alignment portion 118 is provided with a declined groove 118a having a thickness G. A declined surface 118b is formed on the bottom portion of the groove 118a so that the chip components A in the first reservoir 104 slip down on the inclined surface 118b toward the second reservoir 106. The thickness G is same as the thickness of the second reservoir 106. As a result, the declined groove 118a of the second alignment portion 118 of the alignment plate 114 works as a part of the second reservoir 106.

The alignment plate 114 moves up and down between a lowest position shown in FIGS. 10 and 13 and a highest position shown in FIG. 14 such that the chip components A are smoothly guided from the first reservoir 104 to the path 108 through the second reservoir 106, as explained below.

In the second embodiment, the first alignment portion 116 and the second alignment portion 118 are both formed integrally in the alignment plate 114. However, a first alignment portion and a second alignment portion may be respectively formed in independent alignment plates.

A component attitude changing mechanism 122 having a changing groove is disposed in the upper stream portion of the component alignment path 108 within the housing 102 of the chip components feeder 100. The mechanism 122 is the same as the mechanism 76 shown in FIG. 6. By the component attitude changing mechanism 122, the attitudes of the chip components A are changed by 90 degrees in the direction perpendicular to the chip component moving out direction so that the vacuumed surface 74 faces upwardly.

A roller device 124 for conveying out the chip components is disposed in the downstream portion of the component alignment path 108. The roller device 124 is composed of a non-driven roller 124a disposed at the right-hand side in FIG. 7, a driven roller 124b disposed at the left-hand side and a conveyor belt 124c connected with the non-driven and driven rollers 124a and 124b for conveying the chip components A.

Referring to FIGS. 14 and 15, a component separation device 126, which separates each component A from the other chip components and then picks up each separated chip component, is disposed on the front end of the conveyor belt 124c of the roller device 124. The component separation device 126 is composed of a stopper member 128 for individually stopping the chip components A conveyed by the conveyor belt 124c at the front end of the conveyor belt 124c and a cover member 130 for preventing the chip components A from dropping out from the component alignment path 108. The stopper member 128 is provided with a groove 128a for receiving an chip component A. The stopper member 128 is movable in a direction J which is perpendicular to the component moving direction I shown in FIG. 14. The cover member 130 is provided with a window 130a through which the chip component A is picked up after the stopper member 128 has moved along the direction J to the position shown in FIG. 15. Thus, FIG. 14 shows the position at which the stopper member 128 receives the chip component A, and FIG. 15 shows the position at which the chip component A is picked up through the window 130a of the cover member 130.

Referring back to FIG. 7, an automatic mounting device 24 is disposed at the chip component supplied side of the chip component feeding apparatus 100. The automatic mounting device 24 is provided with a nozzle 26 for individually picking up the components.

The driven roller 124b, the alignment plate 114 and the stopper member 128 are connected to a single drive source (not shown). The drive source is disposed within the housing 102, and examples of the drive source are a motor, an air-cylinder and the like. The driven roller 124b, the alignment plate 114 and the stopper member 128 are driven by the drive source at a predetermined timing which is synchronized with an upward and downward motion of the automatic mounting device 24. As a result, the chip. component is picked up at this predetermined timing.

In operation, the component container 4 containing the chip components A in bulk is attached to the upper opening 110 of the first component reservoir 104, and then the chip components A in the container 4 are supplied into the first reservoir 104.

The chip components A three-dimensionally stored in bulk in the first reservoir 104 slip down by their weights along the bottom portion 112 of the first reservoir 104. At this time, some of the chip components A smoothly fall down directly from the first reservoir 104 to the second reservoir 106. However, as shown in FIG. 10, a first group of the chip components A, which is aligned along the bottom portion 112 of the first reservoir 104 and is about to fall down by their own weight, and a second group of the chip components A, which is about to fall down on the declined surface 116a of the first alignment portion 116 of the alignment plate 114, are sometimes excessively concentrated at the downward portion of the bottom portion 112, and as a result the first group of the chip components A can not fall into the second component reservoir 106. However, according to the second embodiment, as shown in FIG. 12, the second group of the chip components A on the declined surface 116a is forced to move upwardly by the upward motion of the first alignment portion 116 of the alignment plate 114. As a result, the excessive concentration of the chip components A is resolved. At this time, the chip components A are aligned again, and the chip components A, having a two-dimensional bulk condition under which the chip components A are not overlapped in their thickness direction, slip smoothly downwardly by their own weight toward the second component reservoir 106 through the declined groove 118a of the second alignment portion 118. Thus, the chip components A are two-dimensionally stored in the second reservoir 106 under the condition that the chip components A are not overlapped in their thickness direction. Then, as shown in FIG. 13, the first alignment portion 116 of the alignment plate 114 moves downwardly. Such upward and downward motions of the alignment plate 114 are repeated at the predetermined timing.

Next, the chip components A thus stored in the second reservoir 106 slip down by their own weight along the bottom portion 120 of the second reservoir 106. At this time, as shown in FIG. 10, the first group of the chip components A, which is aligned along the bottom portion 120 of the second reservoir 106 and is about to fall down by their weight, and the second group of the chip components A, which is about to fall down from the declined groove 118a of the second alignment portion 118 of the alignment plate 114, are sometimes excessively concentrated at the downward portion of the bottom portion 120, and as a result the first group of the chip components A can not fall into the component alignment path 108. However, according to the second embodiment, as shown in FIG. 12, the second group of the chip components A in the declined groove 118a is forced to move upwardly by the upward motion of the second alignment portion 118 of the alignment plate 114. As a result, the excessive concentration of the chip components A is resolved. At this time, the chip components A are aligned again, and the chip components A slip smoothly downwardly by their own weight toward the alignment path 108. Then, as shown in FIG. 13, the second alignment portion 118 of the alignment plate 114 moves downwardly. As explained above, such upward and downward motions of the alignment plate 114 are repeated at the predetermined timing.

The chip components A thus introduced into the alignment path 108 fall by their own weight into the component attitude changing mechanism 122 at which the attitudes of the chip components A are changed by 90 degrees, and then the chip components A are moved out to the roller device 124. The chip components A are conveyed by the conveyor belt 124c of the roller device 124 and are stopped by the leading chip component A coming in contacting with the groove portion 128a of the stopper member 128 (see FIG. 14). At this time, the chip components A are slipping onto the conveyor belt 124c.

After the groove portion 128a of the stopper member 128 receives with sureness the chip component A, the stopper member 128, as shown in FIG. 15, horizontally moves a predetermined distance in the direction J which is perpendicular to the component moving direction of the conveyor belt 124c. Since the chip component A received in the groove portion 128a is separated from following chip components A by the horizontal movement of the stopper member 128, the pressure which the following chip components A apply to the chip component A in the groove portion 128a is released and therefore the chip component A in the groove portion 128a is easily picked up.

Further, the cover member 130 prevents the chip components A from dropping out from the component alignment path 108. Through the window 130a of the cover member 130, the chip component A are individually picked up by the nozzle 26 of the automatic mounting device 24.

In the second embodiment, the alignment plate 114, the driven roller 124b and the stopper member 128 are synchronously driven by the single drive source at a predetermined timing.

Figure 16:
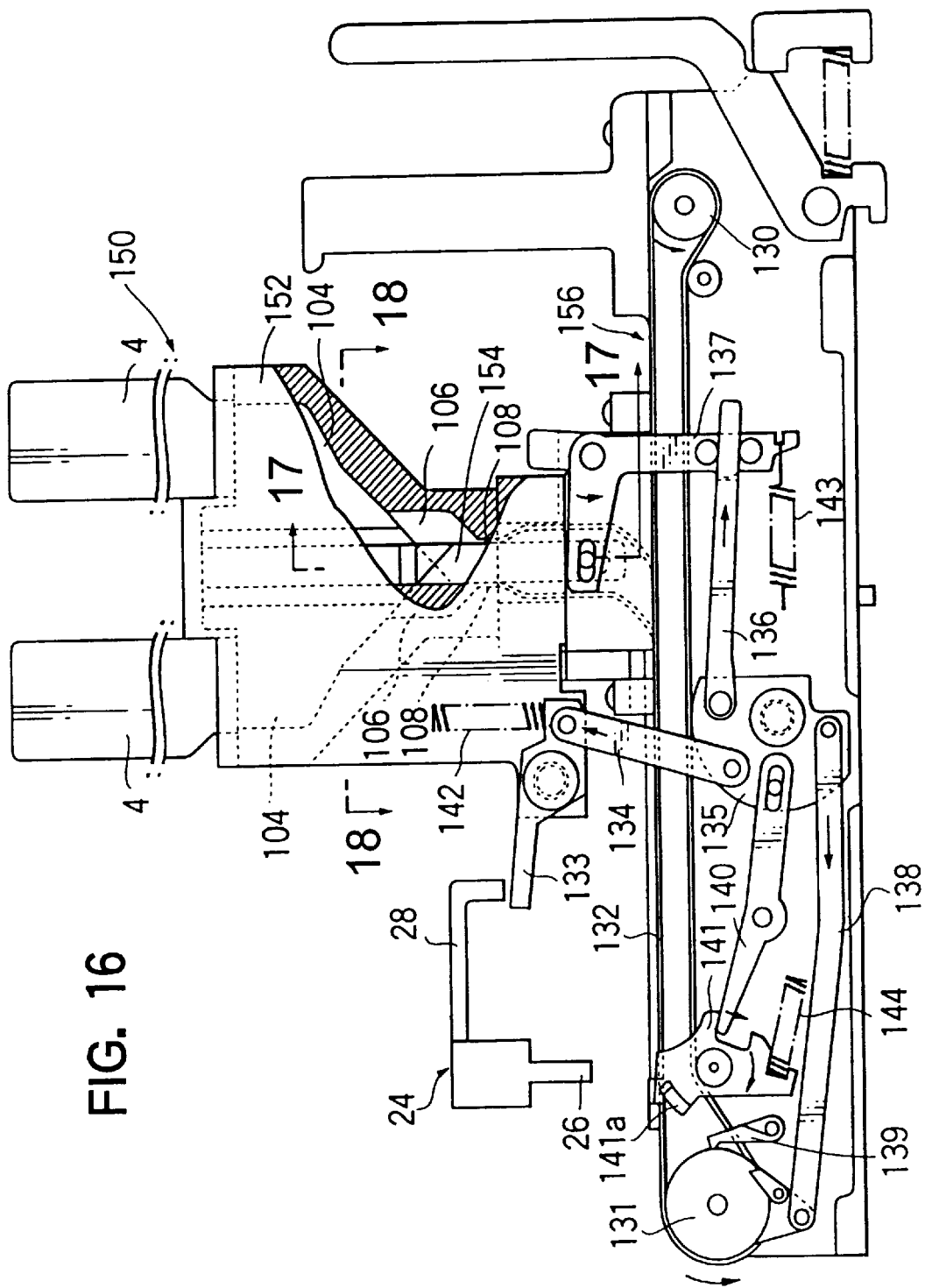
FIG. 16 is a partial front sectional view showing a chip component feeding apparatus according to a third embodiment of the present invention.
Figure 17:
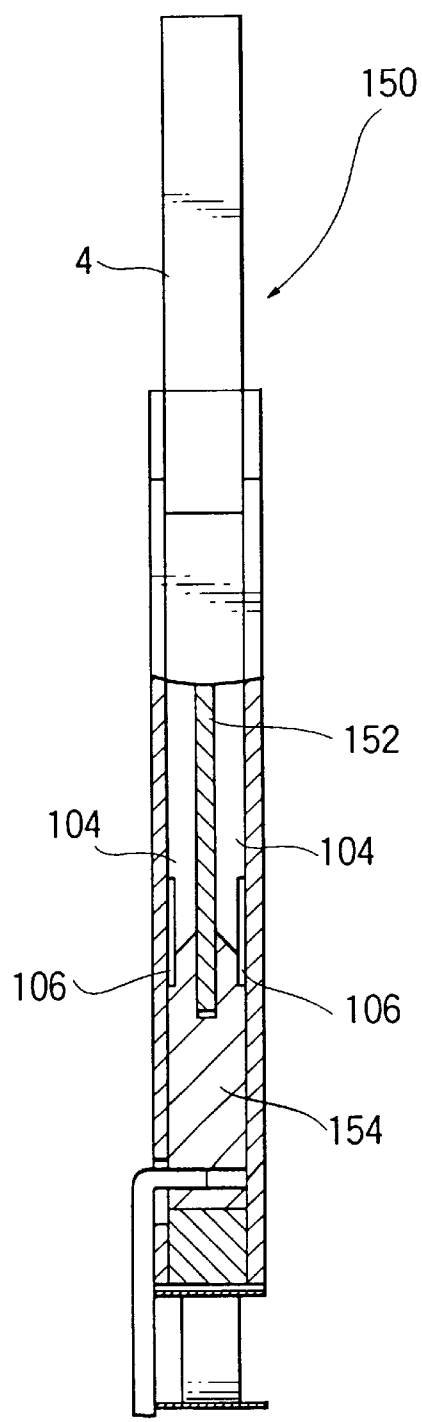
FIG. 17 is a partial side sectional view as taken along line K—K in FIG. 16.
Figure 18:
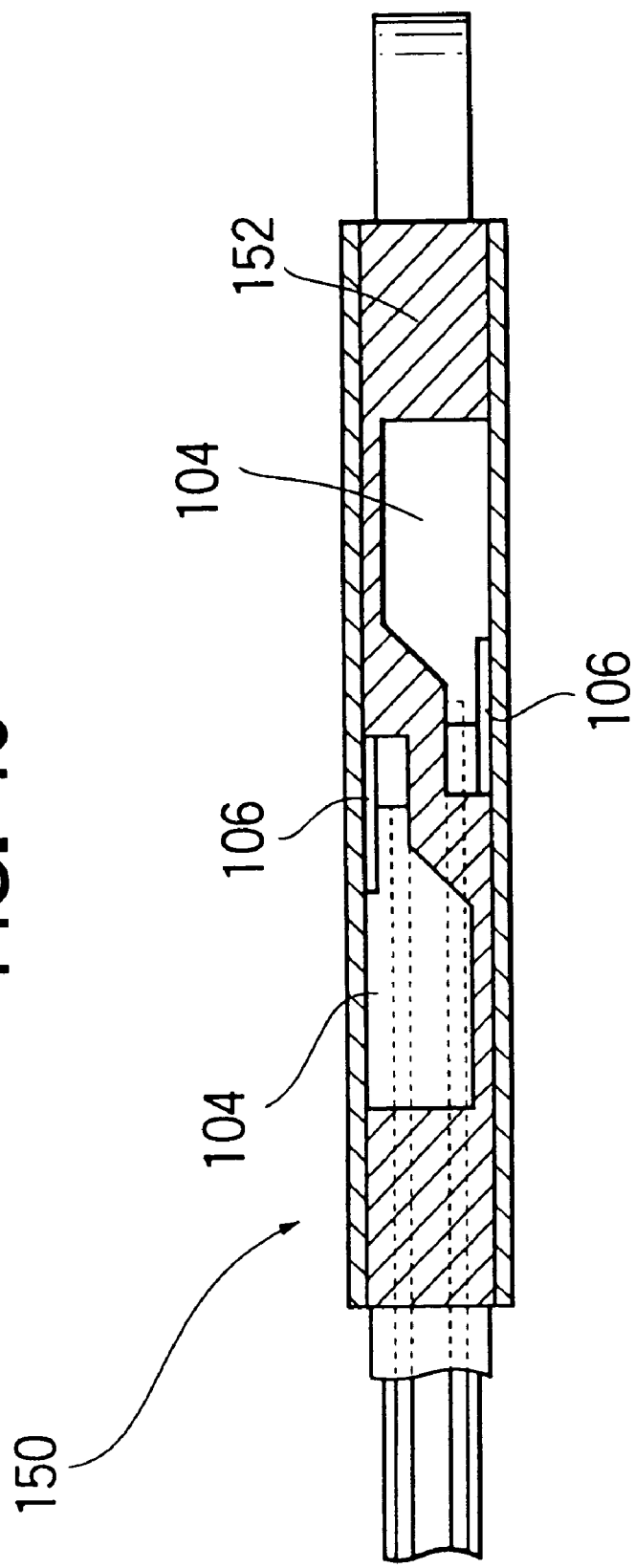
FIG. 18 is a partial sectional view as taken along line M—M in FIG. 16.
Figure 19:
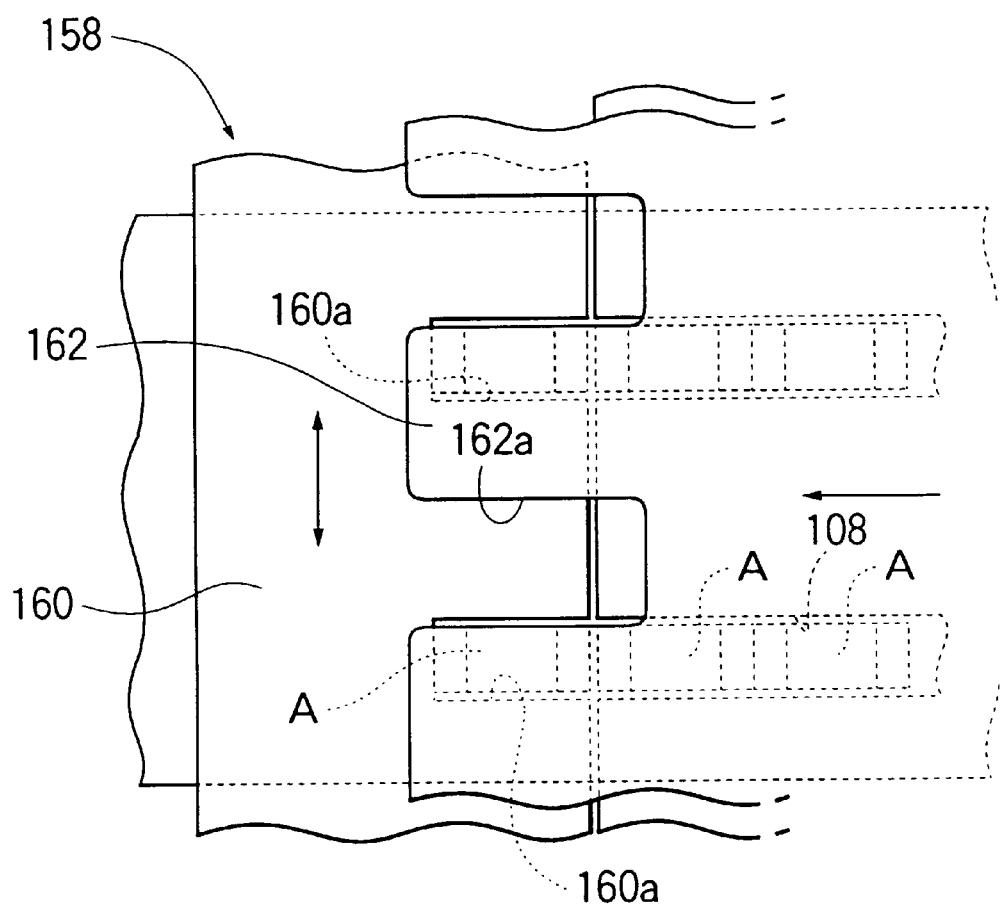
FIGS. 19 and 20 are partial plan views respectively showing a component separating operation at an end of a roller device according to the third embodiment.
Figure 20:
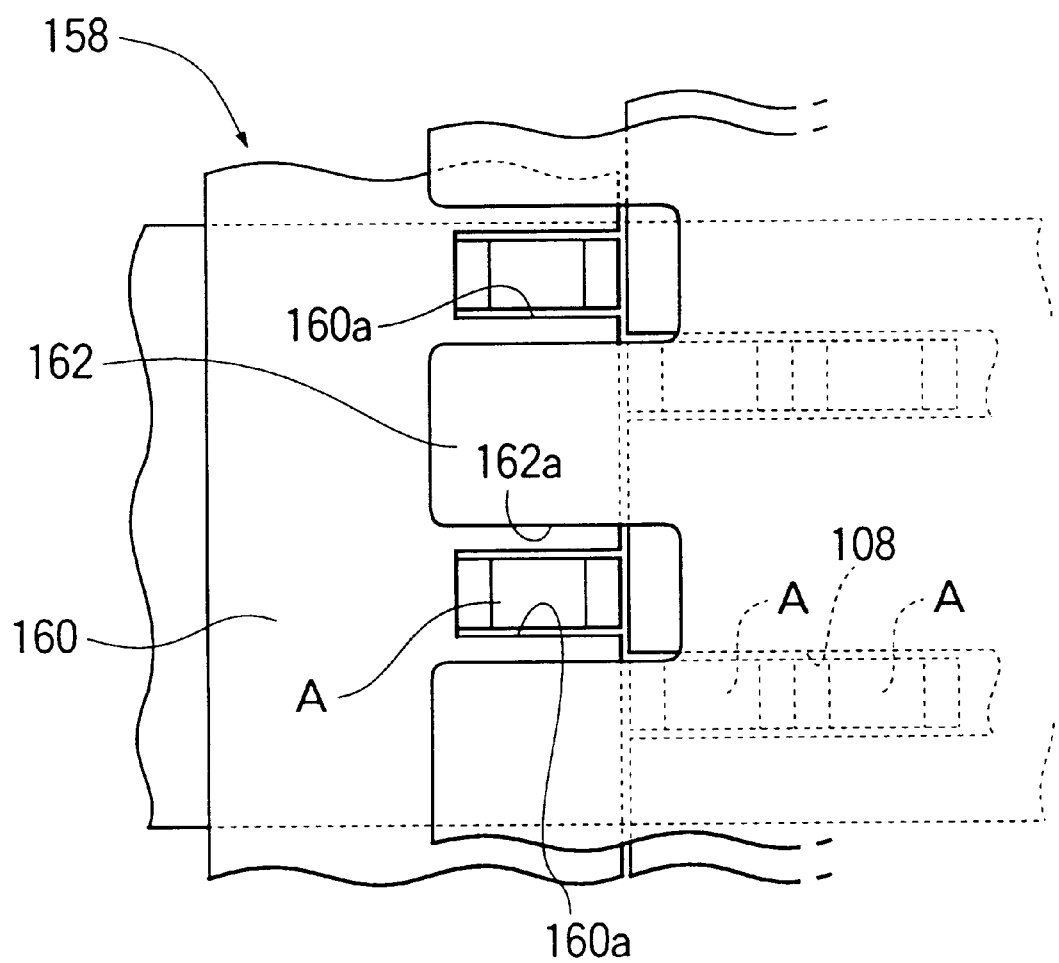

A third embodiment of the present invention will now be explained with reference to FIGS. 16–20. FIG. 16 is a front sectional view showing a chip components feeder, FIG. 17 is a partial sectional view taken along line K—K in FIG. 16, FIG. 18 is a partial sectional view taken along line M—M in FIG. 16, and FIGS. 19 and 20 are partial plan views respectively showing a component separating operation at an end of a roller device. The structures in the third embodiment, which are as same as those in the second embodiment, have the same reference numerals as those in the second embodiment, and therefore such structures in the third embodiment are not explained here. In the third embodiment, the component containers 4, the first component reservoirs 104, the second component reservoirs 106 and the component alignment paths 108 employed in the second embodiment are respectively disposed at the front side and the rear side (the right side and the left side in FIG. 16) of the chip component feeding apparatus. Further, a housing, an alignment plate, a roller device and a component separation device are commonly used at the front side and the rear side of the apparatus.

That is, a chip component feeding apparatus 150 is provided with a housing 152 in which the component containers 4, the first component reservoirs 104, the second component reservoirs 106 and the component alignment paths 108 are respectively disposed at the front side and the rear side of the chip component feeding apparatus 150 so that these containers 4, reservoirs 104,106 and paths 108 are disposed with a point symmetry in a horizontal plan as shown in FIG. 18.

An alignment plate 154 is provided within the housing 152. The alignment plate 154 has a point symmetry structure in which the first alignment portions and the second alignment portions, which are the same as those of the second embodiment, are disposed at the front side and the rear side thereof.

A component separation device 158 is composed of a stopper member 160 and a cover member 162. The stopper member 160 is provided with two groove portions 160a which respectively correspond to the two component alignment paths 108, and the cover member 162 is similarly provided with two windows 162a. FIG. 19 shows the position at which the stopper member 160 receives the chip component A, and FIG. 20 shows the position at which the chip component A is picked up through the corresponding window 162a of the cover member 162.

Referring to FIG. 16, a roller device 156 has structures which are operated at a predetermined timing by the upward and downward motions of the automatic mounting device 24. That is, the roller device 156 is provided with rollers 130 and 131 respectively disposed in an upstream portion and a downstream portion of the component moving direction, a conveyor belt 132 connecting the rollers 130 and 131, a first lever 133 having one end pushed down by the arm 28 of the automatic mounting device 24, a second lever 134 having one end connected with other end of the first lever 133, a first rotating disc 135 which is connected with other end of the second lever 134, a third lever 136 whose one end is connected with the first rotating disc 135, a fourth lever 137 which has a L-shape and in which one end of the lever 137 is connected with the other end of the third lever 136 and the other end of the lever 137 is connected with the lower end of the alignment plate 154, a fifth lever 138 in which one end of the lever 138 is connected with the first rotating disc 135 and the other end of the lever 138 is connected with the roller 131, a latch 139 which allows the roller 131 to rotate in only one direction or in only a counterclockwise direction, a sixth lever 140 having one end connected with the first rotating disc 135, a second rotating disc 141 which is connected with the other end of the sixth lever 140 and has a stopper operation member 141a, a first spring 142 which is biased to push down the other end of the first lever 133, a second spring 143 which is biased to pull the one end of the fourth lever 137 so that the alignment plate 154 is located at the highest position as shown in FIG. 16, and a third spring 144 which is biased to push out the second rotating disc 141 so that the second disc 141 can rotate in a clockwise direction.

In operation, the alignment plate 154 is located at the highest position when the automatic mounting device 24 is located at the upper position as shown in FIG. 16. When the automatic mounting device 24 together with the arm 28 moves down, the alignment plate 154 moves down toward the lowest position by the operations of the first lever 133, the second lever 134, the first rotating disc 135, the third lever 136 and the fourth lever 137. At the same time, the roller 131 is not rotated by the operation of the latch 139 although the fifth lever 138 moves the left hand direction in FIG. 16. Further, the sixth lever 140 rotates in a counterclockwise direction, the second disc 141 rotates in a clockwise direction, and as a result the stopper operation member 141a pushes the stopper member 160 so that the stopper member 160 moves to the position shown in FIG. 20. The nozzle 26 moves down and individually picks up the chip components A.

Thereafter, the automatic mounting device 24 moves upwardly. At this time, the roller device 156 is returned back to the original position shown in FIG. 16 by the operations of the first, second and third springs 142,143 and 144. Further, the fifth lever 138 moves to the right hand side by the upward motion of the automatic mounting device 24. As a result, the roller 131 is driven to rotate in a counterclockwise direction a predetermined distance and therefore the conveyor belt 132 conveys the chip components A the predetermined distance in a counterclockwise direction.

Thus, the alignment plate 154 moves up and down at a predetermined timing. According to the third embodiment, similar to the second embodiment, the chip components A contained in the two containers 4 are synchronously supplied to the respective component alignment paths 108 through the respective first reservoirs 104 and the respective second reservoirs 106. Then, the chip components A supplied within the two component alignment paths 108 are respectively received in the groove portions 160a and then the stopper member 160 moves horizontally. Thereafter, the chip components A are individually picked up through the windows 162a of the cover member 162.

According to the third embodiment, since the housing 152, the alignment plate 154, the roller device 156 and the component separation device 158 are commonly used, the manufacturing cost can be reduced. Since the two component alignment paths 108 are disposed on the roller device 156, the apparatus according to the third embodiment can supply twice as many of the chip components as the conventional feeding apparatus. Further, the conveyor belt 132 has the same width of that of the conveyor belt 124c disposed under the single component alignment path in the second embodiment, although there are disposed under the two component alignment paths in this embodiment. Thus, according to the third embodiment, a thin and high density component feeding apparatus can be provided.

Figure 21:
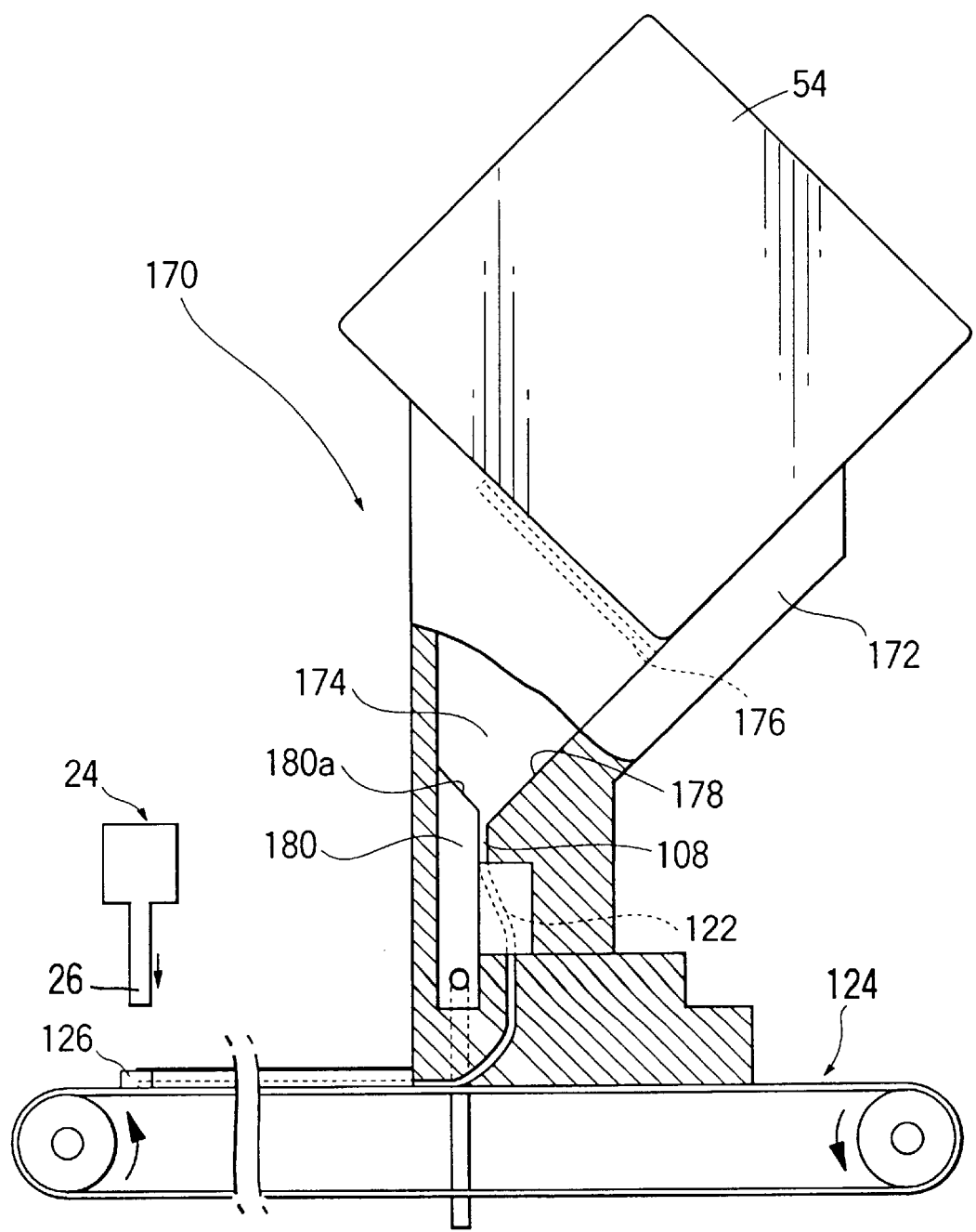
FIG. 21 is a front sectional view showing a chip component feeding apparatus according to the fourth embodiment of the present invention.

A fourth embodiment of the present invention will now be explained with reference to FIG. 21. FIG. 21 is a front sectional view showing a chip components feeder. The structures in the fourth embodiment, which are as same as those in the second embodiment shown in FIGS. 7–15, have the same reference numerals as those in the second embodiment, and therefore such structures in the fourth embodiment are not explained here.

A chip components feeder 170 is provided with a housing 172. A cartridge type chip components container 54 contains many chip components A, such as thousands to tens of thousands. The cartridge type chip component container 54 two-dimensionally contains the chip components A in a space so that the chip components A are not overlapped in their thickness direction and therefore the chip components A are not turned over. Therefore, when the front and rear surfaces of the chip components A have to be determined, the front and rear surfaces of the chip components A are determined and oriented so as to face to the respective same directions in advance, and then the chip components A are contained in the container 54.

The chip component feeding apparatus 170 includes a component reservoir 174 for two-dimensionally storing the chip components A under the condition that the chip components A are not overlapped in their thickness directions and therefore the chip components A are not turned over. The feeding apparatus 170 further includes a component alignment path 108 disposed under the component reservoir 174 for aligning the chip components A in a line.

The cartridge type component container 54 is attached in an inclined manner on an upper opening 176 of the component reservoir 174 within the housing 172, and then the chip components A contained in the container 54 are supplied into the component reservoir 174 under the condition that the chip components A are aligned two-dimensionally.

A bottom portion 178 of the component reservoir 174 is formed to be declined so that the chip components A slip down by their own weights, and the bottom portion 178 is connected to the component alignment path 108.

An alignment plate 180 is disposed between the component reservoir 174 and the component alignment path 108 so as to move up and down. The alignment plate 180 has a thickness which is the same as that of the component reservoir 174. This thickness of the plate 180 is the same as G shown in FIG. 11. The alignment plate 180 is provided with a declined surface 180a at the upper end thereof. FIG. 21 shows the feeding apparatus 170 in which the alignment plate 180 has moved to the highest position.

Further, similar to the second embodiment, the feeder 170 is provided with the component attitude changing mechanism 122, the roller device 124, the component separation device 126 and the like.

In operation, the cartridge type component container 54 two-dimensionally containing the chip components A therewithin (in the condition that the front and rear surfaces of the components are determined and oriented so as to face to the respective same directions in advance, if necessary) is attached to the upper opening 176 of the component reservoir 174, and then the chip components A in the container 54 are supplied into the component reservoir 174 while the two-dimensional condition of the chip components is maintained.

Thus, the chip components A are two-dimensionally stored in the space of the component reservoir 174 under the condition that the chip components A are not overlapped in their thickness directions. Then the chip components slip down along the bottom portion 178 by their own weight. At this time, a first group of the chip components A, which is aligned along the bottom portion 178 of the reservoir 174 and is about to fall down by their own weight, and a second group of the chip components A, which is about to fall down from the declined surface 180a of the alignment plate 180, are sometimes excessively concentrated at the downward portion of the bottom portion 178, and as a result the first group of the chip components A can not fall into the component alignment path 108. However, according to the fourth embodiment, the second group of the chip components A in the declined surface 180a of the plate 180 is forced to move upwardly by the upward motion of the declined surface 180a of the alignment plate 180. As a result, the excessive concentration of the chip components A is resolved. At this time, the chip components A are aligned again, and the chip components A slip smoothly downwardly by their own weight toward the alignment path 108. Then, the declined surface 180a of the alignment plate 180 moves downwardly, and such upward and downward motions of the alignment plate 180 are repeated at a predetermined timing.

Similar to the second embodiment, the chip components A thus introduced into the alignment path 108 move through the component attitude changing mechanism 122, the roller device 124 and the groove portion 128a of the stopper member 128 to the window 130a of the cover member 130 at which the chip components A are individually picked up by the nozzle 26 of the automatic mounting device 24.

Figure 22A:
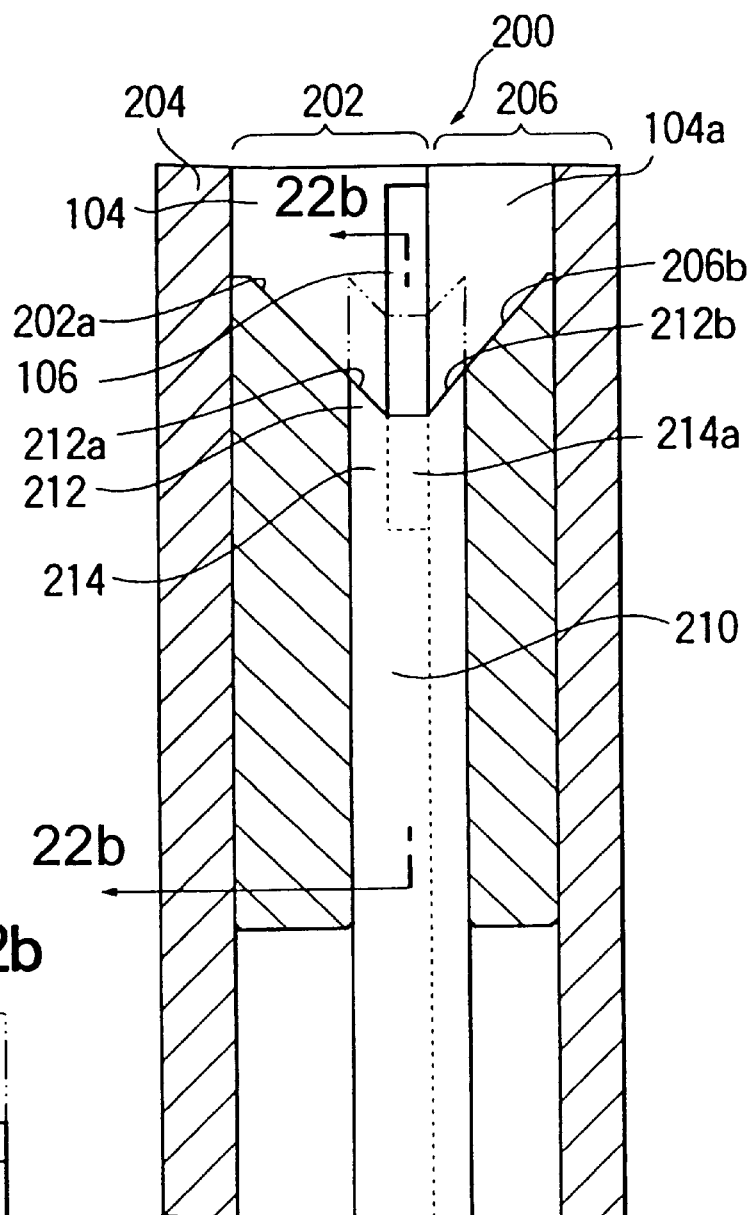
FIG. 22($a$) is an enlarged partial sectional view showing a chip component feeding apparatus and corresponding to FIG. 11 and FIG. 22($b$) is a partial sectional view as taken along line N—N in FIG. 22($a$), according to a fifth embodiment of the present invention.
Figure 22B:
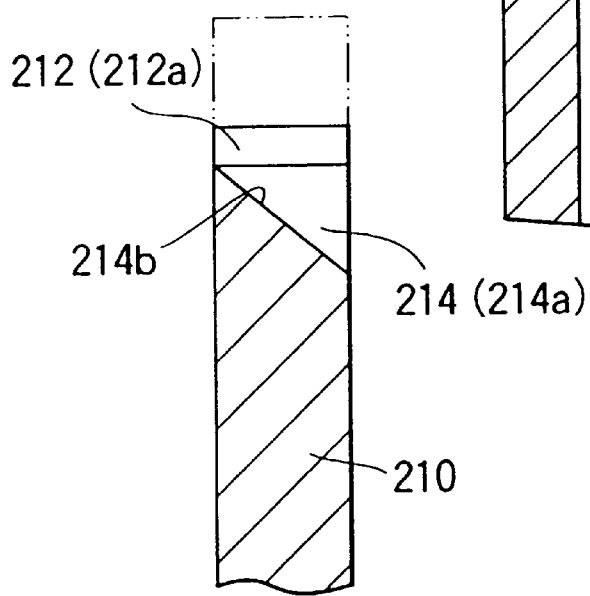

A fifth embodiment of the present invention will be explained with reference to FIG. 22. FIG. 22(a) is an enlarged partial sectional view showing a chip component feeding apparatus, and FIG. 22(a) corresponds to FIG. 11. FIG. 22(b) is a partial sectional view as taken from line N—N of FIG. 22(a).

In the fifth embodiment, a chip component feeding apparatus includes a housing 200 which is composed of a body portion 202, a rear cover 204 and a front cover 206. The body portion 202 is provided with the first component reservoir 104 and the second component reservoir 106 both of which are the same as those of the second embodiment shown in FIGS. 7–15.

In the fifth embodiment, a fixed declined surface 202a is formed in the body portion 202 of the housing 200.

A fixed declined surface 20b is formed in the front cover 206 of the housing 200. The front cover 206 is provided with a cavity 104a which also works as a part of the first component reservoir 104.

An alignment plate 210 includes a first alignment portion 212 and a second alignment portion 214. The first alignment portion 212 is provided with a declined surface 212a which is continuously connected with the declined surface 202a of the body portion 202 when the alignment plate 210 is located at the lowest position (shown as a solid line in FIG. 22). The first alignment portion 212 of the alignment plate 210 is also formed inside of the front cover 206 and the first alignment portion 212 is provided with a declined surface 212b which is continuously connected with the declined surface 206b formed inside of the front cover 206 when the alignment plate 210 is located at the lowest position. The second alignment portion 214 of the alignment plate 210 is provided with a declined groove 214a which is the same as that of the second embodiment shown in FIGS. 7–15. A declined surface 214b is formed at the bottom portion of the declined groove 214a so that the chip components A slip down by their own weight from the second reservoir 106 toward the component alignment path. An imaginary line in FIG. 22 shows the alignment plate 210 which has moved to the highest position.

According to the fifth embodiment, when an excessive concentration of the chip components A in the first component reservoir 104 occurs while the chip components A are being introduced from the first reservoir 104 to the second reservoir 106, the excessive concentration of the chip components A is resolved by the upward motion of the first alignment portion 212 of the alignment plate 210. Therefore, the chip components A slip down smoothly toward the second reservoir 106 through the declined groove portion 214a of the second alignment portion 214. Further, when an excessive concentration of the chip components A in the second component reservoir 106 occurs, the excessive concentration of the chip components A is resolved by the upward motion of the second alignment portion 214 of the alignment plate 210. Therefore, the chip components A slip down smoothly toward the component alignment path.

On the other hand, in the second embodiment shown in FIGS. 7–15, when the alignment plate 114 moves upwardly, some chip components A are caught between the declined surface 116a of the first alignment portion 116 and the inside surface of the front cover of the housing 102 (see FIG. 11). At this time, the inside surface of the front cover may be damaged by such chip components A because of the size, shape or material of the chip components A. In this case, according to the fifth embodiment, since the cavity 104a is formed inside of the front cover 206, the damage caused to the front cover when the alignment plate 210 moves upwardly can be surely avoided.

The structures of the fifth embodiment shown in FIG. 22 may be applied to the third embodiment shown in FIGS. 16–20.

Figure 23:
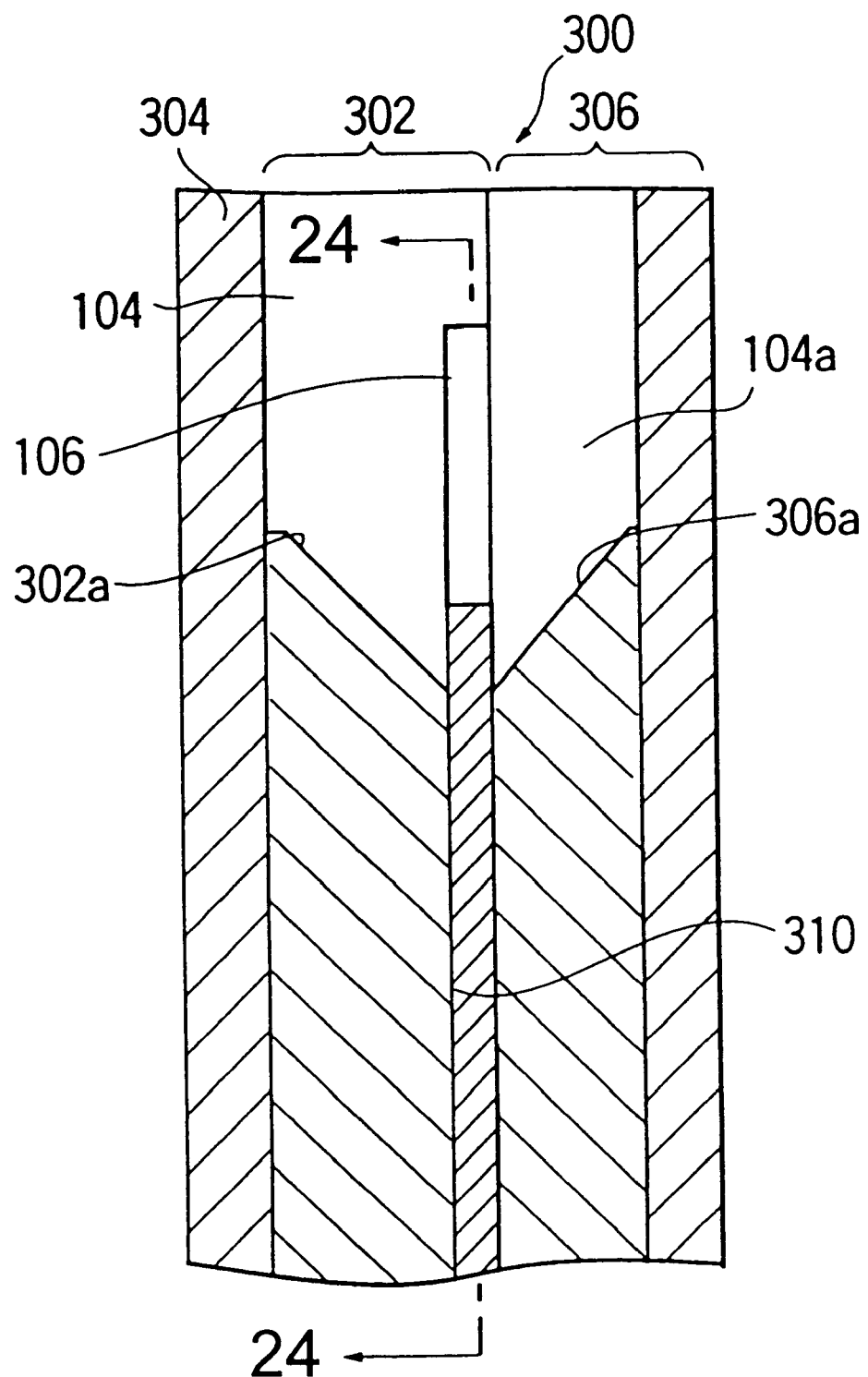
FIG. 23 is an enlarged partial sectional view showing a chip component feeding apparatus according to a sixth embodiment of the present invention.
Figure 24:
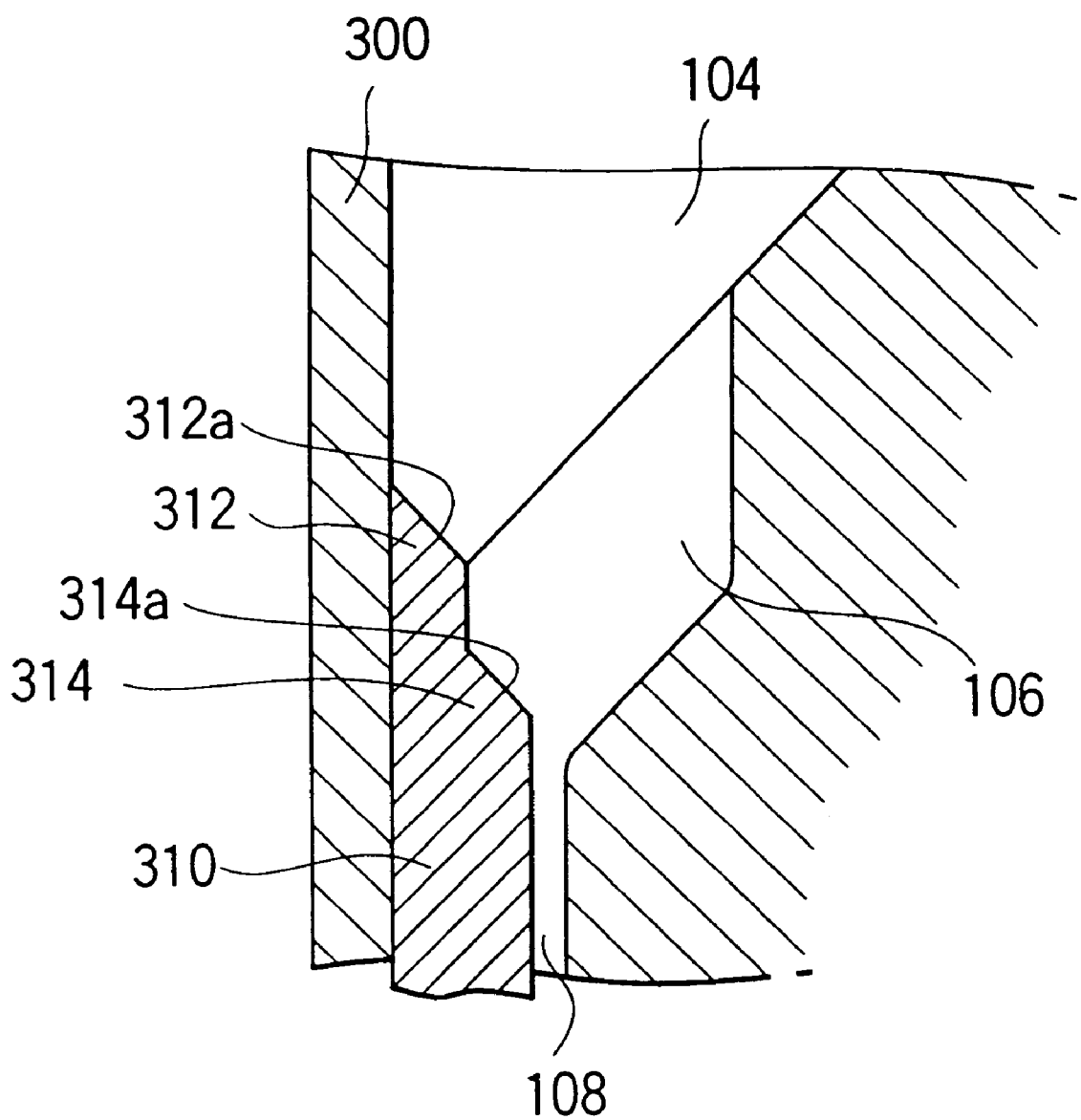
FIG. 24 is a partial sectional view as taken along line P—P in FIG. 23.

A sixth embodiment of the present invention will now be explained with reference to FIGS. 23 and 24. In the sixth embodiment, an alignment plate is modified to have a simpler construction than the alignment plate 210 of the fifth embodiment. FIG. 23 is an enlarged partial sectional view showing a chip component feeding apparatus, and FIG. 24 is a partial sectional view as taken from line P—P of FIG. 23.

In the sixth embodiment, a chip component feeding apparatus includes a housing 300 which is composed of a body portion 302, a rear cover 304 and a front cover 306. The body portion 302 is provided with the first component reservoir 104 and the second component reservoir 106. A fixed declined surface 302a is formed in the body portion 302 of the housing 300.

The front cover 306 is provided with a fixed declined surface 306a and a cavity 104a which also works as a part of the first component reservoir 104.

An alignment plate 310 includes a first alignment portion 312 at an upper end portion thereof and a second alignment portion 314 under the first alignment portion 312. The first alignment portion 312 is provided with a declined surface 312a located between the first component reservoir 104 and the second component reservoir 106, and the second alignment portion 314 is provided with a declined surface 314a located between the second component reservoir 106 and the component alignment path 108. The thickness of the alignment plate 310 is the same as that of the second reservoir 106. The alignment plate 310 is movable up and down between a predetermined highest position (shown in FIG. 24) and a predetermined lowest position. These highest and lowest positions can be changed when necessary.

According to the sixth embodiment, when an excessive concentration of the chip components A in the first component reservoir 104 occurs while the chip components A are being introduced from the first reservoir 104 to the second reservoir 106, the excessive concentration of the chip components A is resolved by the upward motion of the first alignment portion 312 of the alignment plate 310. Therefore, the chip components A in the first reservoir 104 slip down smoothly by their own weight toward the second reservoir 106. Further, when an excessive concentration of the chip components A in the second component reservoir 106 occurs, the excessive concentration of the chip components A is resolved by the upward motion of the second alignment portion 314 of the alignment plate 210. Therefore, the chip components A in the second component reservoir 106 slip down smoothly by their own weight toward the component alignment path 108.

Further, according to the sixth embodiment, similar to the fifth embodiment, since the cavity 104a is formed inside of the front cover 306, the damage caused when the alignment plate 310 moves upwardly can be avoided with sureness.

The structures of the sixth embodiment shown in FIGS. 23 and 24 may be also applied to the third embodiment shown in FIGS. 16–20.

According to the present invention, instead of using the rotating discs and movable alignment plates which are explained above in the first to sixth embodiments, the conventional mechanism such as the vibration type mechanism including a bowl type, a straight-going type, a hopper type and the like, the rotating type mechanism including a drum type, a horizontal type and the like, an oscillation type mechanism including a blade oscillation type, a hopper oscillation type and the like, a belt type mechanism including an escalator type, a horizontal type and the like, and a jet type mechanism including a liquid type and an air type and the like may be used.

The present invention has been described with reference to the preferred embodiments thereof which are intended to be illustrative rather than limiting. Various changes in modifications may be made without departing from the spirit and scope of the present invention in the following claims.

What is claimed is:

1. An apparatus comprising:
   a component container for containing chip components in bulk;
   a first component reservoir for storing the chip components in bulk, the component container being attached to the first component reservoir and the first component reservoir having a declined bottom portion on which the chip components move down by their weight;
   a second component reservoir provided under the first component reservoir for two-dimensionally storing the chip components in a space so that the chip components are not overlapped in a thickness direction, the second component reservoir having a declined bottom portion on which the chip components move down by their own weight;

a component alignment path provided under the second component reservoir for one-dimensionally aligning the chip components, the component alignment path having a cross section which corresponds to a cross section of the chip component;

first alignment means provided between the first component reservoir and the second component reservoir for two-dimensionally aligning the chip components and letting the chip components move down by their own weight, the first alignment means including a first alignment plate which moves up and down in a space provided between the first component reservoir and the second component reservoir;

second alignment means provided between the second component reservoir and the component alignment path for one-dimensionally aligning the chip components and letting the chip components move down by their own weights, the second alignment means including a second alignment plate which moves up and down in a space provided between the second component reservoir and the component alignment path; and means for moving out the chip components on the component alignment path to a predetermined position.

2. An apparatus according to claim 1, wherein said the component alignment path include a component attitude changing mechanism for changing an attitude of the chip component to a predetermined angle.

3. An apparatus according to claim 1, wherein said first and second alignment plates are integrally formed.

4. An apparatus comprising:

a first component reservoir for storing chip components in bulk, a component container which contains chip components in bulk being attachable to the first component reservoir and the first component reservoir having a declined bottom portion on which the chip components move down by their own weight;

a second component reservoir provided under the first component reservoir for two-dimensionally storing the chip components in a space so that the chip components are not overlapped in a thickness direction, the second component reservoir having a declined bottom portion on which the chip components move down by their own weight;

a component alignment path provided under the second component reservoir for one-dimensionally aligning the chip components, the component alignment path having a cross section which corresponds to a cross section of the chip component;

first alignment means provided between the first component reservoir and the second component reservoir for two-dimensionally aligning the chip components and letting the chip components move down by their own weight, the first alignment means including a first alignment plate which moves up and down in a space provided between the first component reservoir and the second component reservoir;

second alignment means provided between the second component reservoir and the component alignment path for one-dimensionally aligning the chip components and letting the chip components move down by their own weight, the second alignment means including a second alignment plate which moves up and down in a space provided between the second component reservoir and the component alignment path; and means for moving out the chip components on the component alignment path to a predetermined position.

5. An apparatus according to claim 4, wherein the component alignment path includes a component attitude changing mechanism for changing an attitude of the chip component to a predetermined angle.

6. An apparatus according to claim 4, wherein said first and second alignment plates are integrally formed.

* * * * *